US012593527B2

(12) United States Patent
Ko et al.

(10) Patent No.: US 12,593,527 B2
(45) Date of Patent: Mar. 31, 2026

(54) BINARY COLLOIDAL QUANTUM DOT TECHNOLOGY

(71) Applicant: NEW JERSEY INSTITUTE OF TECHNOLOGY, Newark, NJ (US)

(72) Inventors: Dong Kyun Ko, Millburn, NJ (US); Shihab Bin Hafiz, Harrison, NJ (US); Mohammad Mostafa Al Mahfuz, Harrison, NJ (US)

(73) Assignee: NEW JERSEY INSTITUTE OF TECHNOLOGY, Newark, NJ (US)

( * ) Notice: Subject to any disclaimer, the term of this patent is extended or adjusted under 35 U.S.C. 154(b) by 386 days.

(21) Appl. No.: 18/206,342

(22) Filed: Jun. 6, 2023

(65) Prior Publication Data

US 2023/0411544 A1    Dec. 21, 2023

Related U.S. Application Data

(60) Provisional application No. 63/353,703, filed on Jun. 20, 2022.

(51) Int. Cl.
| | |
|---|---|
| *H10F 77/14* | (2025.01) |
| *B82Y 20/00* | (2011.01) |
| *B82Y 30/00* | (2011.01) |
| *H10F 77/20* | (2025.01) |

(52) U.S. Cl.
CPC .......... *H10F 77/1433* (2025.01); *B82Y 20/00* (2013.01); *B82Y 30/00* (2013.01); *H10F 77/206* (2025.01)

(58) Field of Classification Search
None
See application file for complete search history.

(56) References Cited

U.S. PATENT DOCUMENTS

| | | | | |
|---|---|---|---|---|
| 2008/0057311 | A1* | 3/2008 | Hollingsworth ..... | C09K 11/881 |
| | | | | 257/E29.069 |
| 2010/0013376 | A1* | 1/2010 | Maskaly ............... | B82Y 20/00 |
| | | | | 313/503 |
| 2014/0174905 | A1* | 6/2014 | Landry ............... | B01J 27/0573 |
| | | | | 502/343 |
| 2021/0301141 | A1* | 9/2021 | Choi ...................... | H10K 30/35 |
| 2022/0037544 | A1* | 2/2022 | Sun ......................... | H10F 10/16 |
| 2023/0098450 | A1* | 3/2023 | Eisensmith ........... | H10F 39/197 |
| | | | | 257/444 |

FOREIGN PATENT DOCUMENTS

| | | | | |
|---|---|---|---|---|
| WO | WO-2016120392 A1 * | 8/2016 | ............. | G01S 17/66 |
| WO | WO-2017044805 A1 * | 3/2017 | ............. | H10K 30/82 |

(Continued)

OTHER PUBLICATIONS

"Expanding the Vision of Sensor Materials", National Academies Press (1995).

(Continued)

*Primary Examiner* — Michael Lebentritt
(74) *Attorney, Agent, or Firm* — SERVILLA WHITNEY LLC

(57) ABSTRACT

A binary CQD device is disclosed, which could include a MWIR-absorbing intraband CQD with another type of CQD. The binary CQD device could include a MWIR-absorbing intraband silver selenide (Ag$_2$Se) CQD with a lead sulfide (PbS) CQD.

21 Claims, 13 Drawing Sheets

*Unimpeded flow of photoexcited electrons*

IR radiation $1S_e$    $1P_e$    $1S_e$ $1S_e$

*Dark hole flow blocked*    *Dark electron flow blocked*

Type-B CQD    Ag$_2$Se CQD    Type-B CQD

(56) References Cited

FOREIGN PATENT DOCUMENTS

WO    WO-2018084602 A1 *   5/2018   ........... G01N 27/414
WO    WO-2020051687 A1 *   3/2020   ............ H10F 10/16

OTHER PUBLICATIONS

Bagavathiappan, S., et al., "Infrared thermal imaging for detection of peripheral vascular disorders", Journal of Medical Physics, vol. 34, No. 1, 2009, 43-47.

Buurma, Christopher, et al., "MWIR imaging with low cost colloidal quantum dot films", Proc. of SPIE vol. 9933 993303-1.

Chen, Menglu , et al., "Size Distribution Effects on Mobility and Intraband Gap of HgSe Quantum Dots", J. Phys. Chem. C 2020, 124, 16216-16221.

Del' Papa Moreira Scafutto, Rebecca , et al., "Detection of Methane Plumes Using Airborne Midwave Infrared (3-5 um) Hyperspectral Data", Remote Sens. 2018, 10, 1237; doi:10.3390/rs10081237.

Deng, Zhiyou, et al., "Colloidal Quantum Dots Intraband Photodetectors", vol. 8, No. 11, 11707-11714, 2014.

Downs, Chandler, et al., "Progress in Infrared Photodetectors Since 2000", Sensors 2013, 13, 5054-5098; doi:10.3390/s130405054.

Haddadi, A., et al., "Mid-wavelength infrared heterojunction phototransistors based on type-II InAs/AlSb/ GaSb superlattices", Appl. Phys. Lett. 109, 021107 (2016); https://doi.org/10.1063/1.4958715.

Hafiz, Shihab Bin, et al., "Intraband Quantum Dot Barrier Devices—Optimization of Energy Level Alignment", ECS Transactions, 102 (1) 45-51 (2021).

Hafiz, Shihab B., et al., "Mid-Infrared Colloidal Quantum Dot Based Nanoelectronics and Nano-Optoelectronics", 2019 ECS Trans. 92 11.

Hafiz, Shihab B., et al., "Silver Selenide Colloidal Quantum Dots for Mid-Wavelength Infrared Photodetection", ACS Appl. Nano Mater. 2019, 2, 1631-1636.

Hafiz, Shihab Bin, et al., "Vertically Stacked Intraband Quantum Dot Devices for Mid-Wavelength Infrared Photodetection", ACS Appl. Mater. Interfaces 2021, 13, 937-943.

Kagan, Cherie R., et al., "Building devices from colloidal quantum dots", Materials Science, Aug. 26, 2016, vol. 353 Issue 6302.

Klem, Ethan, et al., "PbS colloidal quantum dot photodiodes for low-cost SWIR sensing", Proc. of SPIE vol. 9451 945104-1.

Lan, Xinzheng, et al., "Quantum dot solids showing state-resolved band-like transport", Nature Materials, vol. 19, Mar. 2020, 323-329.

Lhuillier, Emmanuel, et al., "Infrared Photodetection Based on Colloidal Quantum-Dot Films with High Mobility and Optical Absorption up to THz", Nano Lett. 2016, 16, 1282-1286.

Melnychuk, Christopher, et al., "Auger Suppression in n-Type HgSe Colloidal Quantum Dots", ACS Nano 2019, 13, 10512-10519.

Qu, Junling, et al., "Intraband Mid-Infrared Transitions in Ag2Se Nanocrystals: Potential and Limitations for Hg-Free Low-Cost Photodetection", J. Phys. Chem. C 2018, 122, 18161-18167.

Ramiro, Iñigo, et al., "Mid- and Long-Wave Infrared Optoelectronics via Intraband Transitions in PbS Colloidal Quantum Dots", Nano Lett. 2020, 20, 1003-1008.

Rogalski, A, "HgCdTe infrared detector material: history, status and outlook", Rep. Prog. Phys. 68 (2005) 2267-2336.

Rogalski, Antoni, "Infrared detectors: status and trends", Progress in Quantum Electronics 27 (2003) 59-210.

Rogalski, A, et al., "Infrared devices and techniques", Opto-Electronics Review 10(2), 111-136 (2002).

Rogalski, A., et al., "Third-generation infrared photodetector arrays", Journal of Applied Physics 105, 091101 (2009).

Tang, Xin, et al., "Plasmon resonance enhanced colloidal HgSe quantum dot filterless narrowband photodetectors for mid-wave infrared", Cite this: J. Mater. Chem. C, 2017, 5, 362.

Temple, Dorota, et al., "Towards low-cost infrared imagers: how to leverage Si IC ecosystem", Proc. of SPIE vol. 9989 99890E-1.

* cited by examiner

BINARY COLLOIDAL QUANTUM DOT TECHNOLOGY

CROSS-REFERENCE TO RELATED APPLICATIONS

This application claims priority to U.S. Provisional Application No. 63/353,703, filed Jun. 20, 2022, the entire disclosure of which is hereby incorporated by reference herein.

TECHNICAL FIELD

Embodiments of the disclosure generally relate to infrared sensing and imaging. In particular, the present disclosure relates to a binary colloidal quantum dot technology for uncooled thermal infrared sensing and imaging.

BACKGROUND

Optoelectronics engineered from colloidal quantum dots (CQDs) benefit from a greatly simplified device fabrication procedure with a dramatic reduction in cost compared to traditional bulk semiconductor devices [1]. The impact that CQD-based devices would bring is expected to be significant especially in the area of infrared sensing and imaging, which are currently dominated by epitaxial semiconductor technologies [2, 3, 4].

For example, mercury cadmium telluride (HgCdTe) has been a golden standard material for fabricating imaging chips, known as focal plane arrays (FPAs), operating in the mid-wavelength infrared (MWIR, 3-5 μm) and long-wavelength infrared (LWIR, 8-14 μm) spectral regions. However, despite its maturity, HgCdTe FPAs suffer from a high cost of device-quality material growth and a low FPA manufacturability. HgCdTe is a weakly bonded II-VI compound with high Hg vapor pressure making compositionally-uniform growth extremely difficult; in $Hg_{1-x}Cd_xTe$, a 0.001 variation in the composition x is known to drastically change the spectral response [5].

In addition, HgCdTe has a large lattice mismatch with silicon and requires high processing temperatures making it incompatible with silicon readout integrated circuits (ROIC). This has forced manufacturers to fabricate FPAs from two separate wafers, one bearing photodiodes and the other containing silicon ROIC, which are physically bonded (hybridized) together via indium bumps [6]. The complexity of multiple production steps simultaneously reduces yield and increases overall cost.

An infrared CQD-based photodetector can provide attractive solutions to overcome these limitations. Spectral response can be tuned simply by adjusting the CQD size, and monolithic fabrication of FPA can be readily achieved via solution-processing of CQDs directly onto ROICs at the wafer-scale [7]. From a performance standpoint, short-wavelength infrared (SWIR, 1-2.7 μm) photodiodes based on PbS CQD have achieved high detectivities of >$10^{12}$ Jones at room temperature, which is a detector performance comparable to commercial indium gallium arsenide (InGaAs) detectors. Recent demonstration of low-cost SWIR and MWIR imaging [8,9] have heightened the interest in this new class of CQD-based FPAs. It is envisioned that the successful implementation of infrared CQD photodetector technology may parallel the broad impact brought by low-cost complementary metal-oxide-semiconductor (CMOS) visible cameras that are ubiquitously used today.

The technological advantage of extending the spectral response toward longer thermal infrared lies in the fact that detectors do not require an illumination source for imaging (passive imaging) and have the ability to see through air-borne obscurants, such as smoke, mist, and fog [10]. LWIR imagers are particularly effective in detecting the human body as our body emission has its Plank distribution maximum around 9 μm. These make thermal infrared detectors highly suited for first-responder and search-and-rescue, night driving, machine vision, and poor weather surveillance applications that require capabilities unmet by visible, NIR, or SWIR detectors. Other applications include industrial process control and preventive maintenance, environmental monitoring of hazardous chemicals [11], non-invasive measurements of temperature for tumor and blood flow [12], as well as free-space optical communications [13].

Among various libraries of CQDs available to date, intraband CQDs—a new subset of semiconductor CQD material that utilizes optical transition between the first and second quantum-confined energy levels—have demonstrated their use in mid-wavelength infrared (MWIR=3-5 m) photodetection [14-24]. In these intraband QDs, it has been studied that Auger recombination can be greatly suppressed, [25] owing to the QD's sparse density of state, thereby allowing higher temperature operation of infrared photodetectors. Achieving high operation temperature constitutes an important milestone for infrared sensors and imagers as it can remove the cryogenic cooling requirement, allowing photodetectors to be manufactured with reduced size, weight, power consumption, and cost. However, intraband CQDs also come with a drawback. Because the first conduction energy level is filled with electrons, the CQD film exhibits high carrier concentration (and thus extremely low dark resistivity). This degenerately-doped nature of CQD film poses a new challenge in realizing high performance photodetector devices.

Thus, there is a need to develop an intraband CQD device that could overcome the dark current limitation.

SUMMARY

In accordance with embodiments of the present disclosure, a binary colloidal quantum dot (CQD) device is disclosed. In one embodiment, the binary CQD device could include a MWIR-absorbing intraband CQD with another type of CQD. In one embodiment, the binary CQD device could include a MWIR-absorbing intraband silver selenide (Ag$_2$Se) CQD with another type of CQD. The other type of CQD could be a lead sulfide (PbS) CQD in one embodiment. The binary CQD device could overcome the dark current limitation while simultaneously offering high performance, uncooled thermal infrared detection.

In one embodiment, an intraband CQD-based photoconductive device is disclosed that exhibits a 4.5 μm peak responsivity of 0.56 A/W with corresponding external quantum efficiency (EQE) reaching 15.3% without cooling (300K).

In one embodiment, an intraband CQD-based p-n junction photodiode is disclosed exhibiting a strong rectifying characteristic and reduced dark current and noise current density, with MWIR detectivity reaching 7.8×$10^6$ Jones without cooling. This was enabled by the binary CQD approach, which helped to overcome the issue arising from the degenerately doped nature of intraband Ag$_2$Se CQDs.

In one embodiment of a binary CQD device, the optimum mixture ratio for MWIR detection was defined as $N_{Ag2Se}$/$N_{PbS}$=0.04 as discussed in relation to the data shown in FIG. 10. It is anticipated that this ratio could increase, thereby improving the MWIR responsivity, if the surface passivation of CQDs can be enhanced. Further improvements in the device performance are anticipated through optimizing the contact properties and investigating various surface capping ligands that can enhance the carrier mobilities in conjunction with improving the surface passivation.

Any combination and/or permutation of the embodiments is envisioned. Other objects and features will become apparent from the following detailed description considered in conjunction with the accompanying drawings. It is to be understood, however, that the drawings are designed as an illustration only and not as a definition of the limits of the present disclosure.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To assist those of skill in the art in making and using the disclosed binary colloidal quantum dot technology and associated systems and methods, reference is made to the accompanying figures, wherein.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

Figure 1:
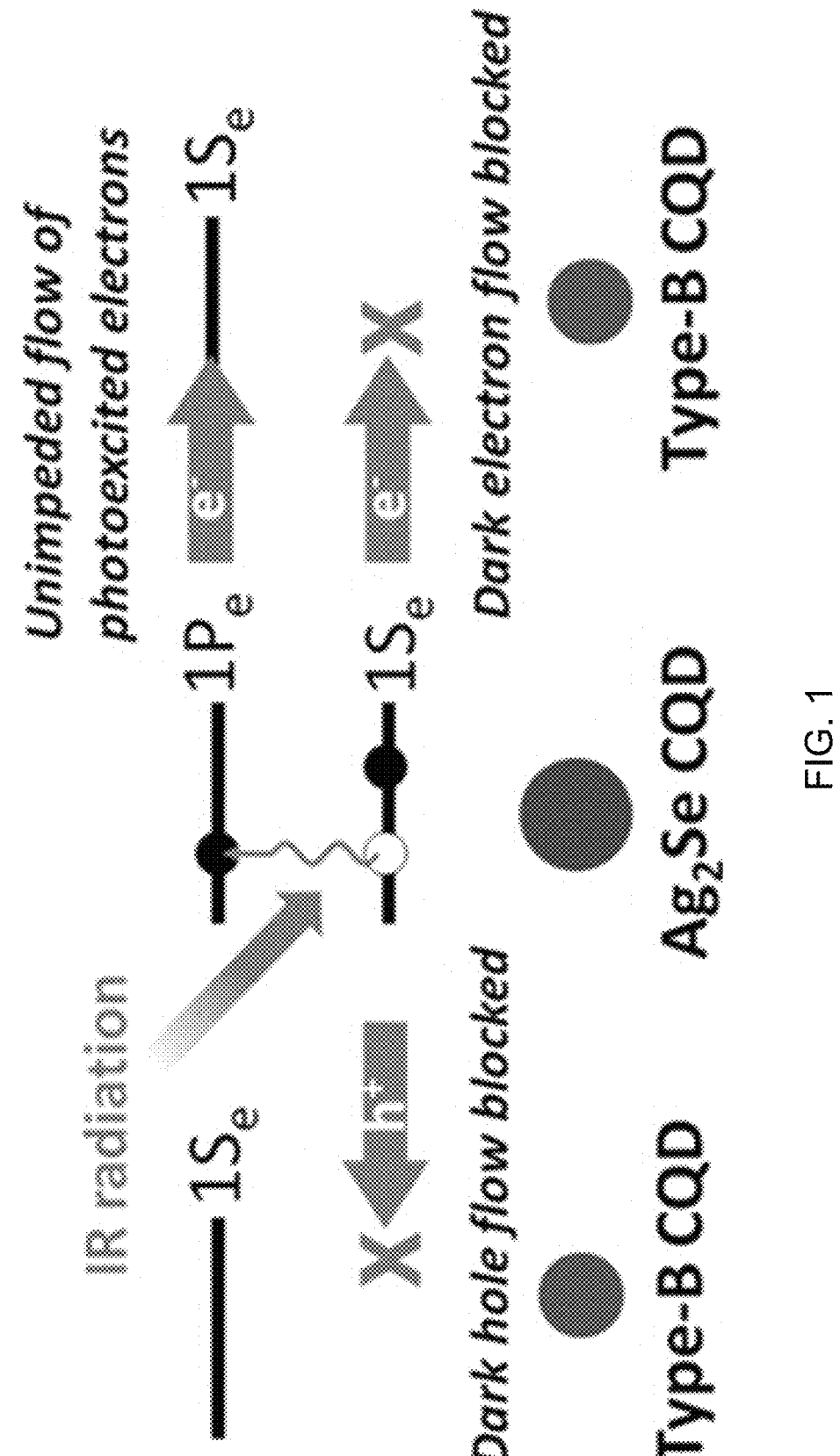
FIG. 1 is a schematic depicting a mechanism where creating a binary CQD mixture leads to increased dark resistivity while the flow of photoexcited electrons is unimpeded, in accordance with one embodiment of the present disclosure.

FIG. 1 is a schematic showing one embodiment of a binary CQD mechanism. The binary CQD mechanism could overcome the dark current limitation while simultaneously offering high performance, uncooled thermal infrared detection. This binary CQD device approach utilizes a unique trait only available in CQD material systems: the ability to mix two different CQDs to control the electrical properties of a resulting CQD film.

In one embodiment, a MWIR-absorbing intraband silver selenide (Ag$_2$Se) CQD is mixed with another type of CQD, e.g., "Type-B CQD," such as lead sulfide (PbS) CQD. In one or more embodiments the first mid-wavelength infrared absorbing intraband colloidal quantum dot comprises one or more of silver selenide (Ag$_2$Se), mercury sulfide (HgS), mercury selenide (HgSe), and electron-doped lead sulfide (PbS). In one or more embodiments, the second colloidal quantum dot comprises one or more of lead sulfide (PbS), lead selenide (PbSe), lead telluride (PbTe), cadmium sulfide (CdS), cadmium selenide (CdSe), cadmium telluride (CdTe), zinc sulfide (ZnS), zinc selenide (ZnSe), zinc telluride (ZnTe), tin sulfide (SnS), tin selenide (SnSe), tin telluride (SnTe), indium phosphide (InP), indium arsenide (InAs), indium antimonide (InSb), gallium phosphide (GaP), gallium arsenide (GaAs), and gallium antimonide (GaSb). In one or more embodiments, PbS CQD serves to block the transport of ground state electrons and holes, which are responsible for dark current, while providing an unimpeded flow of photoexcited electrons, as shown in FIG. 1. Specifically, the transport of ground state electrons and holes in $1S_e$ level of $Ag_2Se$ CQDs is blocked by the presence of PbS CQDs since there are no available energy levels to accommodate these carriers in PbS CQDs. The photoexcited electrons in $1P_e$ level of $Ag_2Se$ CQDs, however, can flow uninterruptedly through the $1S_e$ level of PbS CQDs since the energy level for transport is well aligned. This binary design significantly reduces the dark current, by decreasing the number of dark free carriers, while simultaneously allowing efficient transport and collection of photoexcited carriers for high infrared responsivity.

While the present embodiment discloses a MWIR-absorbing intraband CQD, it will be understood that other suitable MWIR-absorbing intraband CQDs as well as LWIR CQDs could be employed, such as degenerately-doped semiconductor CQDs consisting of group I-VI, II-V, II-VI, III-V, IV-VI elements. Likewise, it will be understood that other suitable free carrier-blocking CQDs besides a PbS CQD could be employed, including semiconductor and insulator CQDs of various sizes that can be used to create energy level alignment depicted in FIG. 1.

The binary CQD device disclosed herein exhibited significantly improved dark resistivity ($2 \times 10^5$ $\Omega \cdot cm$) compared to devices made solely from $Ag_2Se$ CQDs ($1 \times 10^3$ $\Omega \cdot cm$). Using this binary CQD approach, the number of free carriers is greatly reduced (ground state electrons and holes become immobile), which is evidenced by the orders of magnitude increase in the dark resistivity (binary CQD film: $2 \times 10^5$ $\Omega \cdot cm$ vs $Ag_2Se$ CQD-only film: $1 \times 10^3$ $\Omega \cdot cm$. See supporting information Example 1 below.

In one or more embodiments, the binary colloidal quantum device includes a nanoparticle layer on the top surface of the binary colloidal quantum dot layer. The nanoparticle layer may comprise any suitable material known to the skilled artisan. In one or more embodiments, the nanoparticle layer comprises one or more of zinc oxide (ZnO), titanium oxide ($TiO_2$), tin oxide ($SnO_2$), or n-type conductive polymers including but not limited to poly(benzimidazobenzophenanthroline) ladder type and semi-ladder type, poly(bisindenofluorenedicyanovinylene), poly(naphthalene diimide) derivatives, and poly(perylene diimide) derivatives. In specific embodiments, the nanoparticle layer comprises zinc oxide (ZnO).

Also, in junction with the ZnO nanoparticle layer, which is a layer commonly used to form p-n junctions with PbS CQDs in many CQD solar cell studies, this binary CQD film could exhibit strong rectifying I-V characteristics. The present embodiment can be modified to allow or block the flow of dark/photocarriers by changing the CQD size or employing different types of CQDs.

Figure 2:
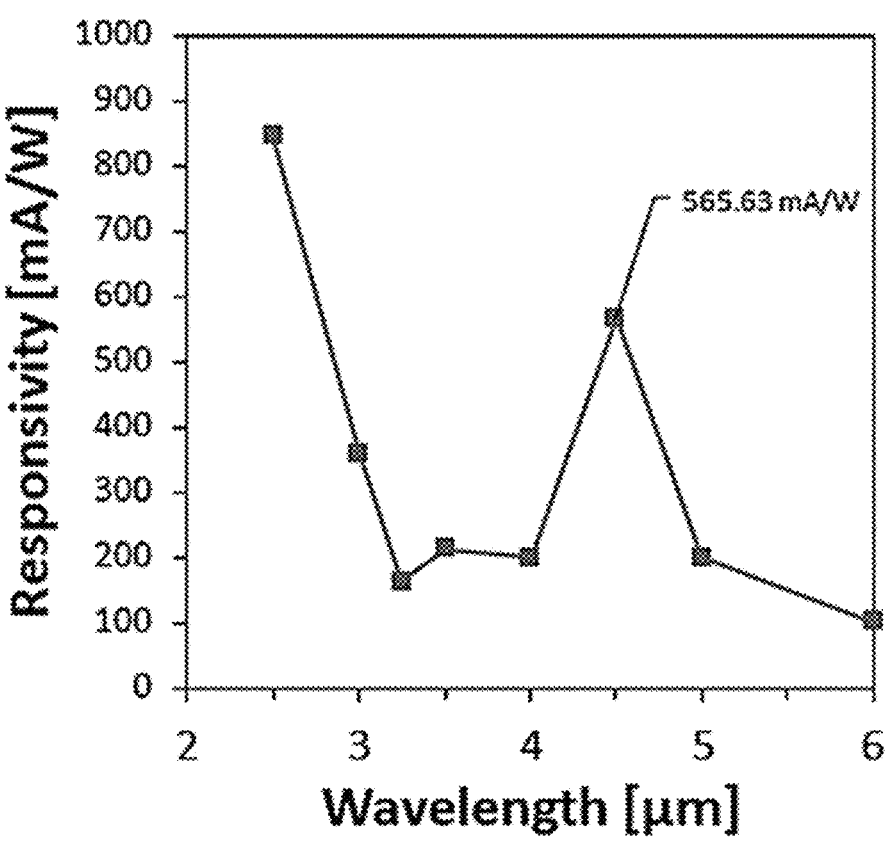
FIG. 2 is a graphical depiction showing spectral responsivity taken from prototype binary CQD photoconductive device.

In terms of infrared detector performance, the binary CQD photoconductive device reaches a 4.5 μm peak responsivity of 0.56 A/W without cooling (300K) with corresponding external quantum efficiency (EQE) of 15.3%, as shown in FIG. 2. The operation of binary CQD devices disclosed herein bears similarity to a traditional QWIP or QDIP device design except these are fabricated using low-cost, solution-processed CQDs.

The materials and the methods of the present disclosure used to fabricate one embodiment of a binary CQD photoconductive device will be described below. While the embodiment discusses the use of specific compounds and materials, it is understood that the present disclosure could employ other suitable compounds or materials. Similar quantities or measurements may be substituted without altering the method embodied below.

Figure 3:
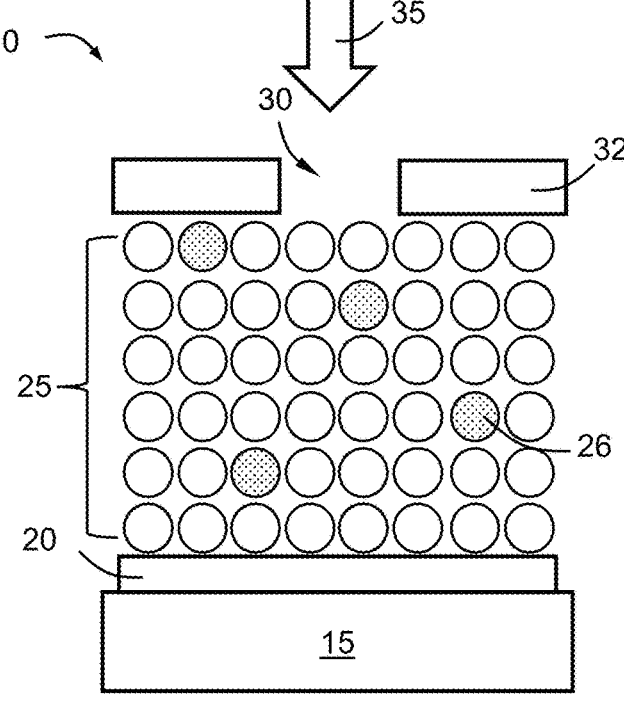
FIG. 3 is a schematic illustration of one embodiment of a binary CQD photoconductive device.

FIG. 3 is a schematic illustration of a device 10 according to one or more embodiments. In one or more embodiments, a Cr/Au electrode is first prepatterned on a glass substrate 15 using a shadow mask to form a bottom contact 20. Then, a thin binary CQD layer 25 is deposited by spin-casting. In one or more embodiments, the binary CQD layer 25 is composed of lead sulfide (PbS) CQDs, in which silver selenide ($Ag_2Se$) CQDs are embedded sparsely as MWIR absorbers or sensitizers. The binary $PbS/Ag_2Se$ CQD layer 25 may be deposited on the bottom contact 20 using spin-casting and a ligand-exchange procedure using 1,2-ethanedithiol (EDT) to improve the electronic coupling between CQDs. In other embodiments, other ligands that can be used for the ligand-exchange include, but are not limited to, organic ligands such as pyridine, ethylenediamine and 3-mercaptopropionic acid as well as inorganic ligands such as sodium sulfide ($Na_2S$), tetrabutylammonium iodide, $NH_4SCN$, $(NH_4)_3AsS_3$, metal chalcogenide ligand, and methylammonium lead triiodide perovskite ligand.

A top gold (Au) contact 32 with an optical opening 30 is formed on a top surface of the binary CQD layer 25. Under bias and with infrared illumination 35, photoexcited electrons generated from the $Ag_2Se$ CQDs 26 contained inside the binary CQD layer 25 will transport down toward the bottom contact 20.

Figure 4:
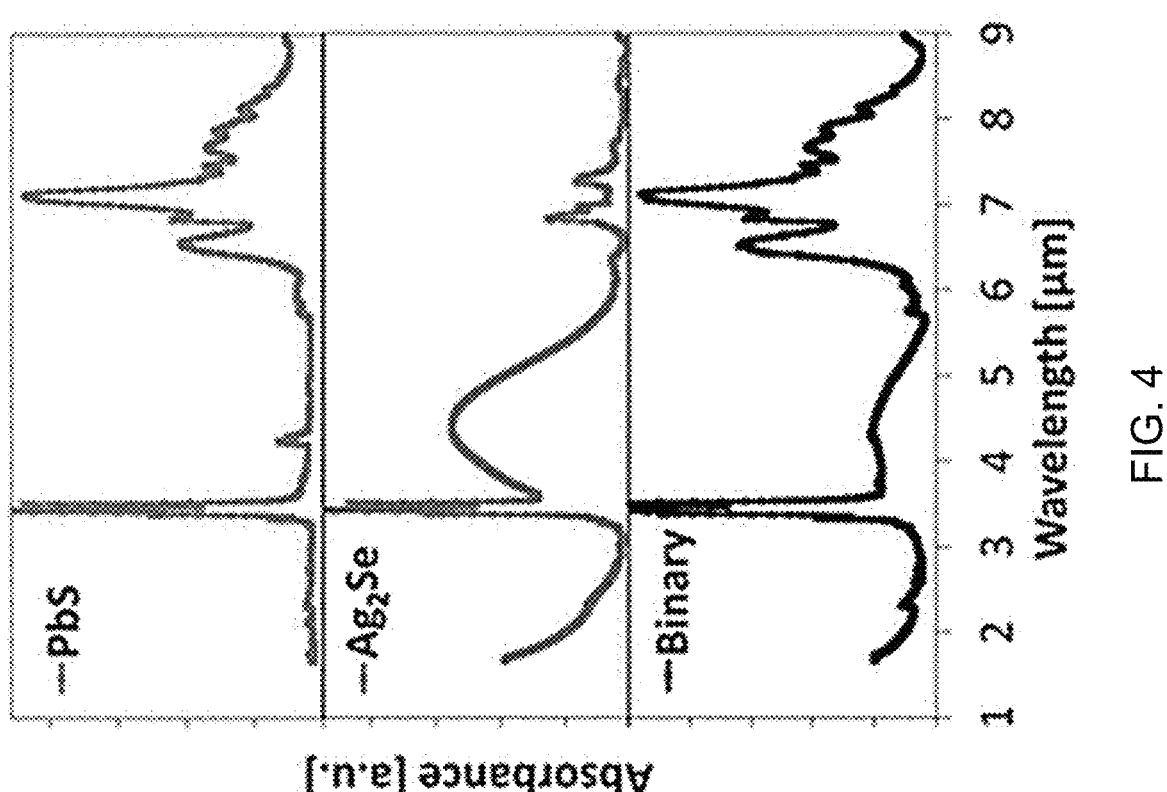
FIG. 4 shows a graphical depiction illustrating optical absorbance characterization of as-synthesized PbS, Ag$_2$Se, and PbS/Ag$_2$Se mixture CQDs using Fourier transform infrared (FTIR) spectroscopy.

Based on the previous study on the energy level alignment between $Ag_2Se$ and PbS CQDs, an $Ag_2Se$ CQD with an average size of 5.5 nm and a PbS CQD with an average size of 3 nm should create a binary CQD system with decreased dark free carriers, as shown in FIG. 1. First, to prepare the CQD materials in one embodiment, $Ag_2Se$ and PbS CQDs were synthesized following previously reported hot-injection protocols. FIG. 4 shows the mid-infrared optical absorption of films made from as-synthesized $Ag_2Se$, PbS, and mixed (optimized mixture ratio of $N_{Ag2Se}/N_{PbS}=0.04$, see more details in FIG. 10) CQDs obtained using Fourier transform infrared (FTIR) spectroscopy.

The PbS CQDs capped with oleic acid show an absence of absorption in a 3.5-6 μm spectral range, which makes them a good candidate for use in the binary CQD approach to modify the film's electrical property. The characteristic peaks around 3.4 μm arise due to vibrational modes of C—H, and the peaks around 4.4, 6.5, and 7.2 μm originate from $CO_2$. Another peak at 7.8 m ($1285$ $cm^{-1}$) arises from the C—O stretch of the oleic acid ligand. The $Ag_2Se$ CQD film shows a distinct intraband absorption peak centered at 4.2 μm, which optically resides within the transparent window of PbS CQDs. Peaks shown around 6.8 μm arise from vibrational modes of trioctylphosphine (TOP). The film composed of a binary $PbS/Ag_2Se$ CQD mixture shows the sum of PbS and $Ag_2Se$ absorption, where the MWIR absorption peak at 4.2 μm arising from $Ag_2Se$ CQD is still predominant.

Figure 5:
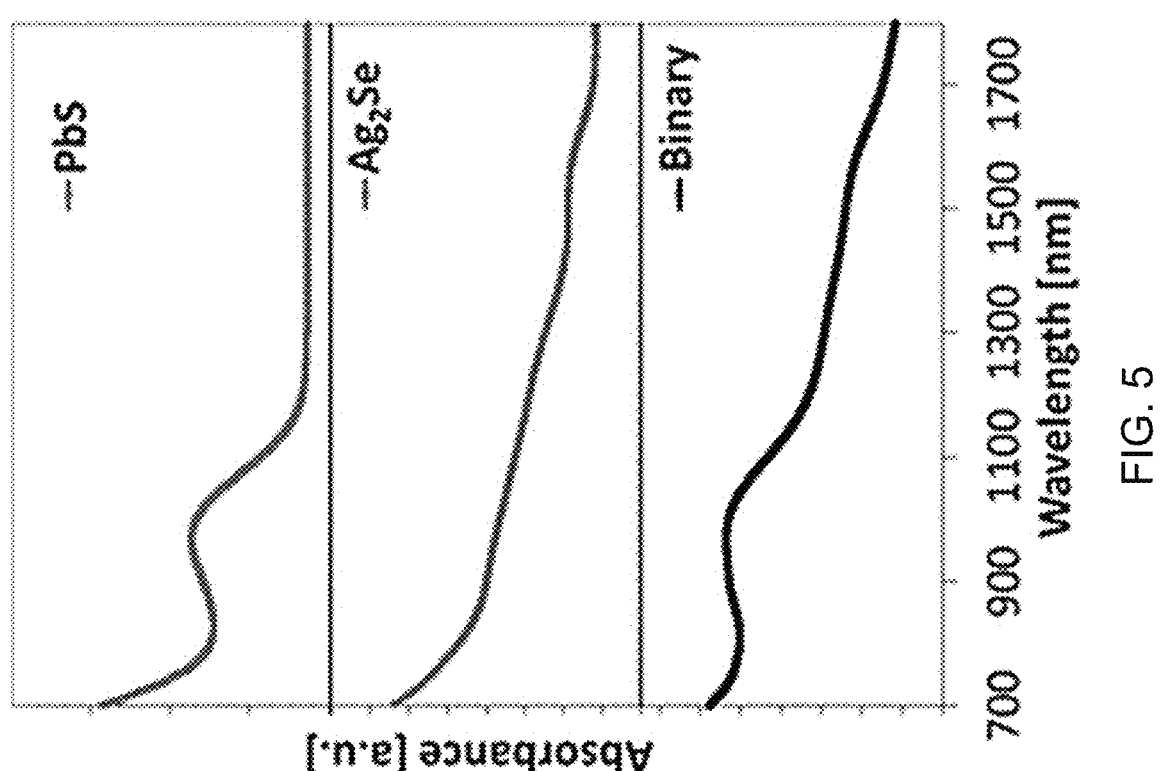
FIG. 5 shows a graphical depiction illustrating optical absorbance characterization of as-synthesized PbS, Ag$_2$Se, and PbS/Ag$_2$Se mixture CQDs using near-infrared spectroscopy.

FIG. 5 shows optical spectra in the near-infrared spectral region obtained from the same CQDs. The PbS CQD shows an absorption peak at 1000 nm, which agrees with the CQD size of 3 nm. On the other hand, $Ag_2Se$ CQDs show a continuous increase in absorbance (without any visible absorption peaks) with decreasing wavelength as the density of states and the number of available transition pathways increase with increasing energy. The binary CQD mixture sample shows a spectrum that combines the optical absorption arising from $Ag_2Se$ and PbS CQDs.

To fabricate the p-n junction diode device in one embodiment, a Cr/Au electrode is first prepatterned on a glass substrate using a shadow mask to form a bottom contact. In one or more embodiments, the bottom contact may include a conductive layer. The conductive layer may be deposited on the top surface of the bottom contact. The conductive layer may comprise any suitable material known to the skilled artisan. In one or more embodiments, the conductive layer comprises one or more of molybdenum oxide (MoOx), nickel oxide (NiO), vanadium oxide ($V_2O_5$), and lead iodide (PbI), or p-type conductive polymers such as polythiophenes, poly(p-phenylene vinylene), polyfluorene, and their derivatives. In specific embodiments, the conductive layer comprises molybdenum oxide (MoOx).

In one or more embodiments, a thin layer of $MoO_x$ (15 nm) is deposited on the top surface of the bottom contact by thermal evaporation. $MoO_x$ has been frequently used in PbS CQD solar cell devices to improve contact between PbS CQD and the metal electrode. This approach could be adopted in the present embodiment of the device, since the binary CQD layer is majorly composed of PbS CQDs, in which $Ag_2Se$ CQDs are embedded sparsely as MWIR absorbers or sensitizers. Next, a binary PbS/$Ag_2Se$ CQD layer was deposited using spin-casting and a ligand-exchange procedure using 1,2-ethanedithiol (EDT) was carried out to improve the electronic coupling between CQDs.

The thickness of the binary CQD layer was increased by repeating this step 10-12 times to create a 200 nm-thick film. It is worth noting that ligand-exchange duration is not a critical processing parameter for binary CQD devices. Devices fabricated from pure $Ag_2Se$ CQDs, in contrast, showed a narrow temporal window that exhibits the maximum MWIR responsivity. This can be understood by reflecting the fact that the majority component of the binary CQD film is PbS CQDs in this embodiment. To form a p-n junction, ZnO nanoparticles were synthesized following the literature report and spin-casted on top of a binary CQD layer with a thickness of 80 nm. See Example 2 below for optical absorption of ZnO in the mid-infrared. To complete the device, an Al top contact having two finger electrodes was deposited through a shadow mask. See Example 3 below for Ohmic contact information. The top opening created by the fingers defines the device's optical area of 200×200 μm.

Figure 6:
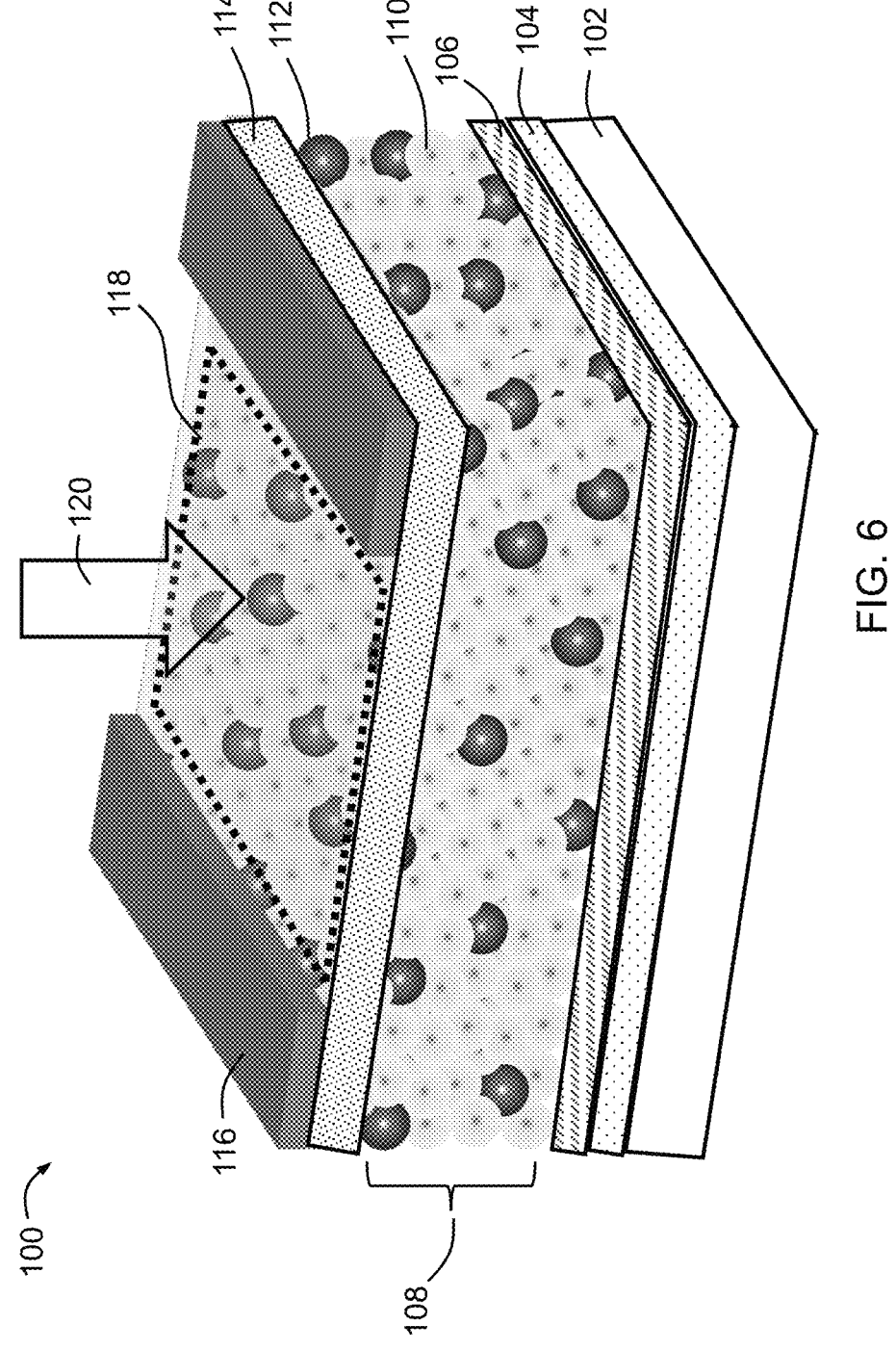
FIG. 6 relates to fabrication of p-n junction diode using binary CQD and is a schematic illustration of a device structure according to one or more embodiments.
Figure 7:
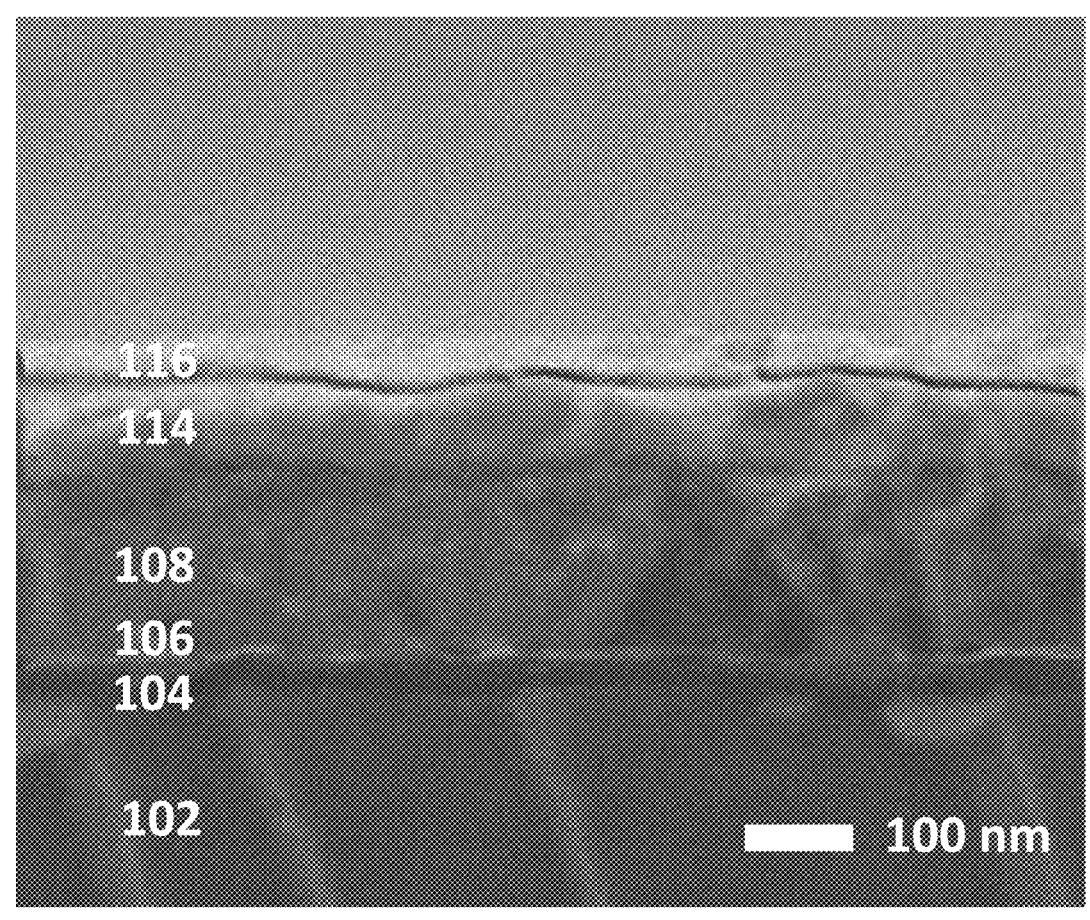
FIG. 7 shows a cross-sectional SEM image of the fabricated device of FIG. 6.

A schematic illustration of this upward-looking photodiode is shown in FIG. 6, and the cross-sectional scanning electron microscope (SEM) image of the device is shown in FIG. 7.

FIG. 6 illustrates a schematic of the device 100, which includes a glass substrate 102 and a bottom contact (Cr/Au) 104 on a top surface of the glass substrate. A $MoO_x$ layer 106 is formed on a top surface of the bottom contact 104. A collective mixture of binary CQDs 108 is on the $MoO_x$ layer 106. The mixture of binary CQDs 108 includes PbS CQD layer 110 and an $Ag_2Se$ CQD layer 112. A ZnO nanoparticle layer 114 is formed on the mixture of binary CQDs 108, and a top contact (Al) 116 is on the ZnO nanoparticle layer 114. The optical area 118 is 200×200 μm. The device 100 is exposed to mid-IR radiation 120.

FIG. 7 shows a cross-sectional SEM image of the fabricated device 100 illustrated in FIG. 6.

Figure 8:
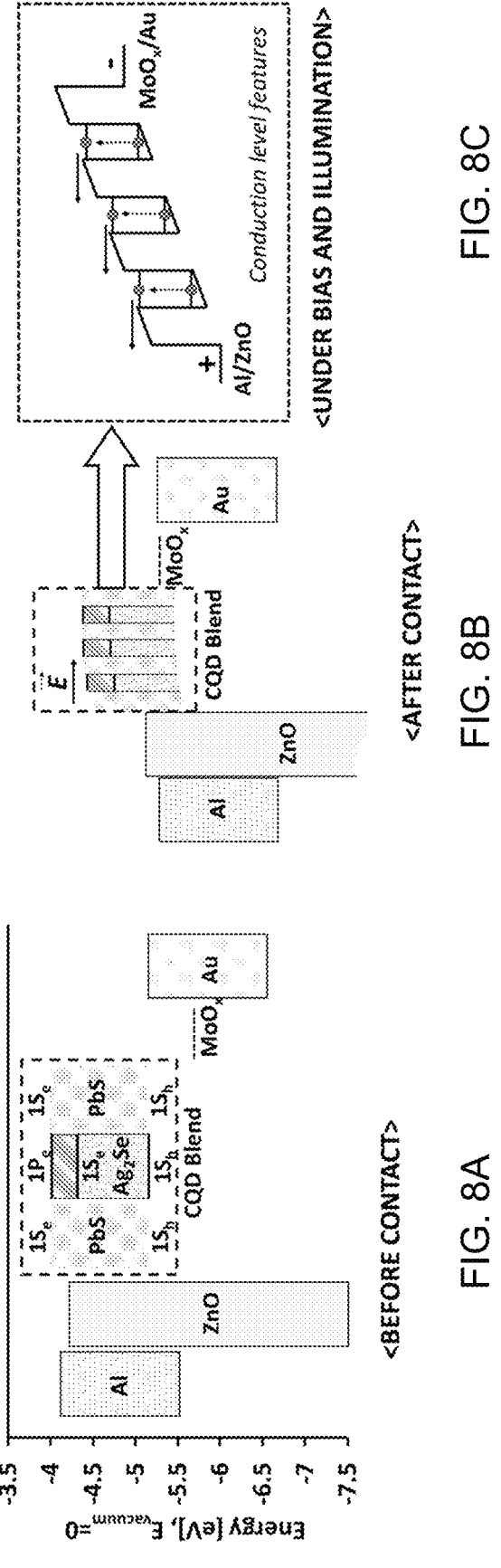
FIG. 8A shows the energy level alignment before contact.
FIG. 8B shows the equilibrium energy level diagram after contact.
FIG. 8C depicts the conduction level features of the binary CQD system under bias and with infrared illumination.

FIG. 8A shows the energy level alignment of the binary CQD p-n junction device materials before contact. $1S_h$, $1S_e$, and $1P_e$ denote first valence energy level, first conduction energy level, and second conduction energy level, respectively. After contact, a ZnO—PbS CQD n-p junction will establish a built-in electric field ($\vec{E}$) toward the binary CQD layer 108 where the $Ag_2Se$ CQDs 112 reside (FIG. 8B). FIG.

8B illustrates the equilibrium energy level diagram after contact. $\vec{E}$ denotes the built-in electric field. Under bias and with infrared illumination, photoexcited electrons generated from the $Ag_2Se$ CQDs will cascade down toward the Al cathode, bearing a resemblance to the operation of epitaxial quantum dot infrared photodetectors (QDIPs), as illustrated in FIG. 8C.

Figure 9:
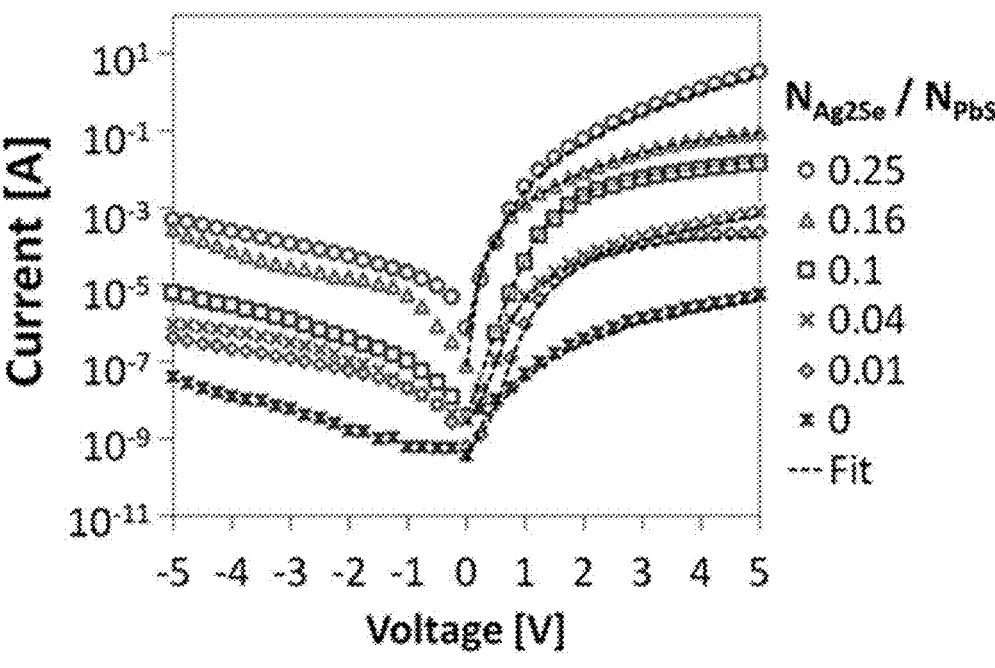
FIG. 9 shows a graphical depiction illustrating electrical characterization of binary CQD p-n junction diodes. A series of dark I-V characteristics obtained from diodes with different binary CQD mixing ratios.

Prior to the photodetector performance characterizations, in one or more embodiments, basic electrical measurements of a p-n junction diode devices were carried out, under dark, with a varying binary CQD mixture ratio. The ratio of $N_{Ag2Se}/N_{PbS}=0.25$, for example, denotes a CQD film having 25 $Ag_2Se$ CQDs per 100 PbS CQDs. See Example 4 for details below. A series of current-voltage (I-V) characteristics were obtained (FIG. 9) and were fitted to a standard diode equation (1):

$$I = I_O\left\{\exp\left[\frac{q}{nkT}(V - IR_S)\right] - 1\right\} + \frac{V - IR_S}{R_{sh}} \qquad (1)$$

where n is the ideality factor, $I_o$ is the dark saturation current, $R_s$ is the series resistance, and $R_{sh}$ is the shunt resistance. In one or more embodiments, four key diode parameters were extracted, as summarized in Table 1. First, it was observed that all diodes exhibit an ideality factor (n) larger than 3. While n typically varies between 1 and 2, n>3 is also frequently reported in diodes with nonideal electrical contacts. This indicates the existence of a contact barrier formed at either the Al/ZnO or binary CQD/$MoO_x$—Au interface in the devices.

Figure 10:
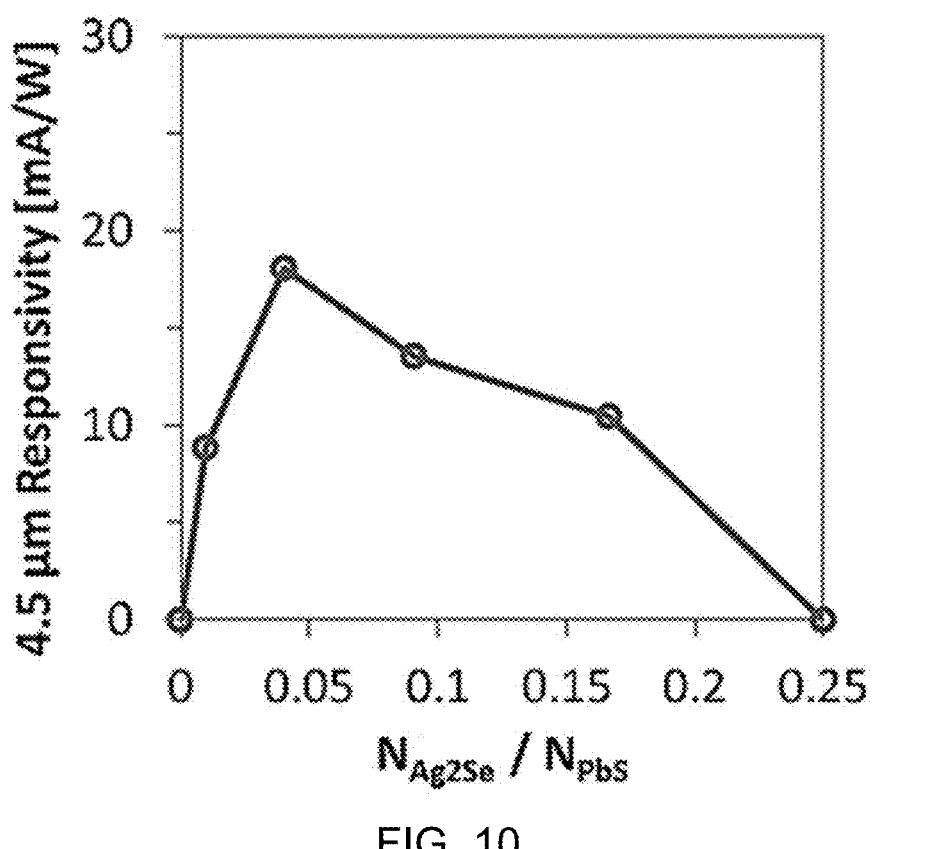
FIG. 10 shows a graphical depiction illustrating electrical characterization of binary CQD p-n junction diodes. Responsivity at 4.5 μm plotted as a function of the binary CQD mixing ratio.
Figure 12:
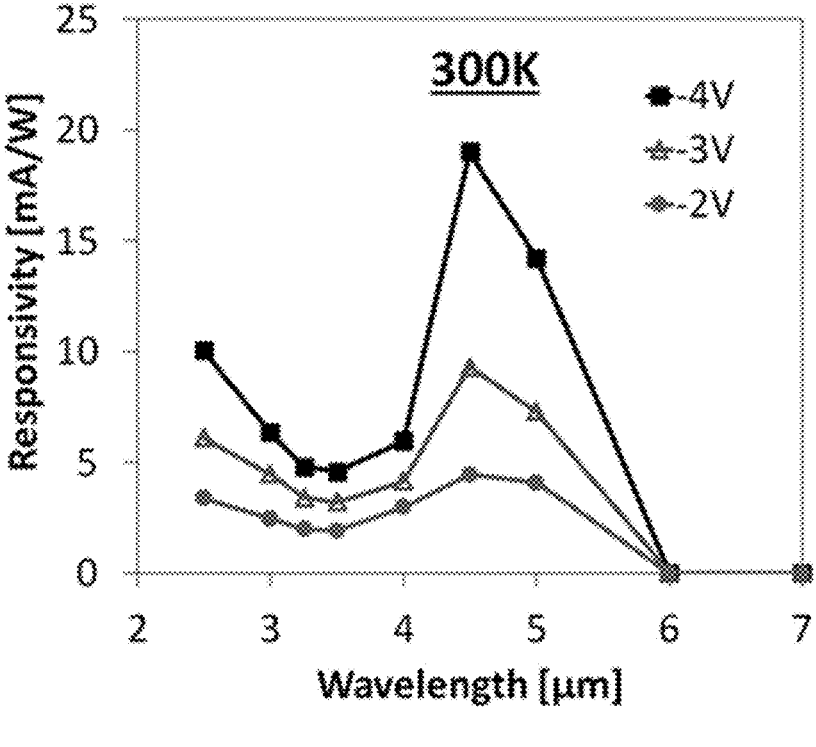
FIG. 12 shows the spectral responsivity measured at various bias voltages. All devices were measured at room temperature, 300 K.

The value of n showing irrelevance to the $N_{Ag2Se}/N_{PbS}$ ratios points to a fact that a barrier may be formed at the Al/ZnO interface. On the other hand, for the reverse saturation current $I_0$, it was observed a distinct trend where increasing $Ag_2Se$ CQD loading (increasing $N_{Ag2Se}/N_{PbS}$ ratio) dramatically increases the magnitude of $I_0$. The value $I_0$ is indicative of how much recombination there is in the p-n junction device. This suggests that as the number of $Ag_2Se$ CQDs is increased in the binary CQD film, $Ag_2Se$ CQD itself or the surface defects associated with $Ag_2Se$ CQD increases the rate of carrier recombination inside the device. This, in turn, influences the optimum binary CQD mixture ratio that yields the highest MWIR peak responsivity in the diode devices, as shown in FIG. 10. FIG. 12 shows the 4.5 μm peak responsivity of the diode device as a function of the $N_{Ag2Se}/N_{PbS}$ ratio. At $N_{Ag2Se}:N_{PbS}=0$, the absence of MWIR-absorbing $Ag_2Se$ CQD induces zero photocurrent at 4.5 μm.

As the $Ag_2Se$ CQD loading is increased, the peak responsivity increases, because more $Ag_2Se$ CQDs will produce a larger number of photoexcited carriers upon infrared illumination. However, as the $Ag_2Se$ CQD loading is increased further, the increase in the photocarrier generation will compete with the increase in the carrier recombination. It is observed that for $N_{Ag2Se}/N_{PbS}>0.04$, the peak responsivity starts to decrease, suggesting that the carrier recombination arising from $Ag_2Se$ CQDs starts to overweight the optical generation. Hence, a peak is observed at $N_{Ag2Se}/N_{PbS}=0.04$, which is defined as the optimum binary CQD mixture ratio for MWIR detection. In some embodiments, the ratio for MWIR detection defined as $N_{Ag2Se}/N_{PbS}$ is in a range of greater than or equal to 0.01 to less than or equal to 0.18. Another important diode parameter of a p-n junction is the shunt resistance $R_{sh}$, which arises from the presence of an electrical shunt path (current leakage) through the p-n junction. In the devices, high $R_{sh}$ is observed for pure CQD film ($N_{Ag2Se}/N_{PbS}=0$), and $R_{sh}$ decreases with increasing $Ag_2Se$ CQD loading. This can be understood by reflecting the fact that, in the binary CQD system, as more $Ag_2Se$ CQDs are introduced, the probability of $Ag_2Se$ CQDs creating a direct percolation path (a highly conductive path, since $Ag_2Se$ CQDs are degenerately n-doped) is more frequent inside the film. See Example 5 below. Lastly, the series resistance $R_s$ is indicative of additional series resistance components present in the device, typically arising from high contact resistances. For $R_s$, in one or more embodiments, no particular trend with $Ag_2Se$ CQD loading was observed, and all the devices show a magnitude of $R_s$ around $10^2\Omega$.

TABLE 1

Summary of Diode Parameters Extracted from I-V Characteristics

| $N_{Ag2Se}/N_{PbS}$ | Ideality Factor (n) | Saturation Current $I_o$ (A) | Shunt Resistance $R_{sh}$ ($\Omega$) | Series Resistance $R_s$ ($\Omega$) |
|---|---|---|---|---|
| 0 | 3.2 | $3.0 \times 10^{-10}$ | $1.7 \times 10^5$ | $4.7 \times 10^2$ |
| 0.01 | 3.8 | $5.0 \times 10^{-8}$ | $7.6 \times 10^4$ | $2.6 \times 10^2$ |
| 0.04 | 3.2 | $5.2 \times 10^{-8}$ | $2.7 \times 10^3$ | $0.9 \times 10^2$ |
| 0.1 | 3.7 | $9.5 \times 10^{-8}$ | $2.2 \times 10^3$ | $1.6 \times 10^2$ |
| 0.16 | 3.4 | $4.0 \times 10^{-6}$ | $1.5 \times 10^3$ | $0.4 \times 10^2$ |
| 0.25 | 3.8 | $8.0 \times 10^{-6}$ | $0.9 \times 10^3$ | $0.5 \times 10^2$ |

In one or more embodiments, using a diode device with the optimum binary CQD mixing ratio identified in FIG. 10 ($N_{Ag2Se}/N_{PbS}=0.04$), the detector performance parameters were characterized using the infrared illumination provided by a calibrated blackbody heated at 900° C., filtered through Ge, which cuts off photons with a wavelength smaller than 1.8 µm.

Figure 11:
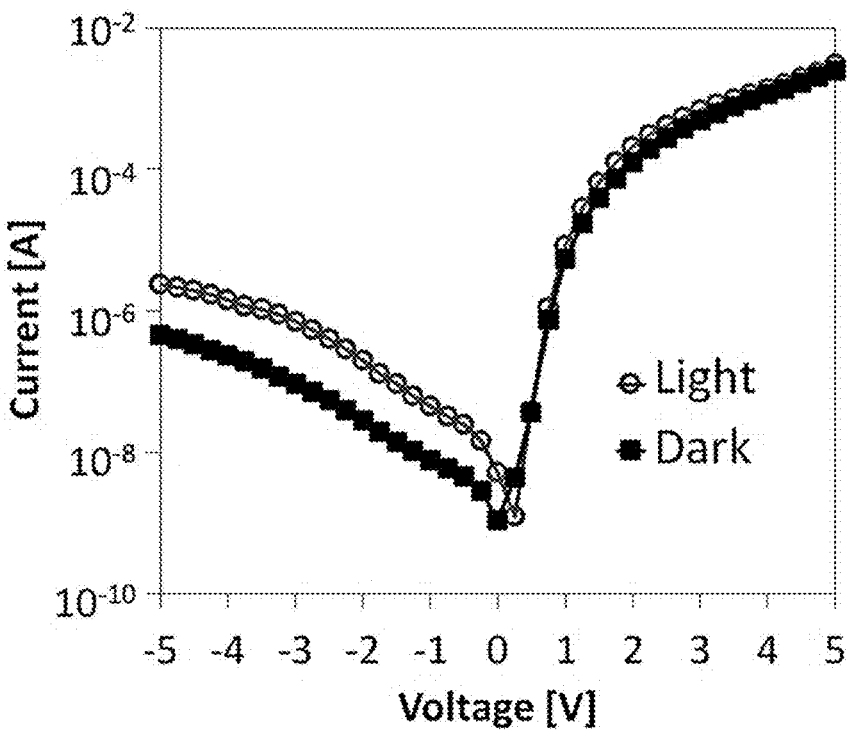
FIG. 11 shows a graphical depiction illustrating detector performance characterization of binary CQD diode devices with an optimized CQD mixture ratio. The I-V characteristics of the device are shown under dark and under infrared illumination. The illumination was provided by a 900° C. calibrated blackbody with a Ge filter.

FIG. 11 shows the diode I-V characteristics obtained under dark and under infrared illumination conditions. The dark I-V shows strong rectifying characteristics with an on/off ratio of $6\times10^3$ at ±5 V. Upon illumination, the device showed a distinct increase in a reverse-biased current with a photovoltage of 250 mV. FIG. 12 shows the spectral responsivity of the device collected at room temperature by replacing the Ge filter with a set of band-pass filters with center wavelengths varying from 2.5-7 µm and measuring the photocurrent using a lock-in technique. The magnitude of photocurrent (~0.17 µA) estimated from the difference between the dark and light curve at a reverse bias of −2.0 V, closely matches with the photocurrent (~0.20 µA) calculated by integrating the area under the curve of spectral photocurrent data extracted from responsivity spectra at a corresponding bias of −2.0 V.

The peak responsivity is obtained at 4.5 µm with the magnitude of the responsivity increasing with increasing reverse bias and reaches a value of 19 mA/W at −4 V. This 4.5 µm peak coincides with the optical absorption arising from $Ag_2Se$ CQDs along with the shape of the spectrum (FIG. 4), indicating that the device responsivity primarily arises from $Ag_2Se$ CQDs inside the binary CQD film. The noise current density ($i_n$) measured using the spectrum analyzer in 1 Hz bandwidth was $4.91\times10^{-11}$ A $Hz^{-1/2}$. See Example 7 below. Using these values, specific detectivity $$(D^* = \frac{R\sqrt{A}}{i_n},$$

10 where A is the detector area, $i_n$ is the noise current density, and R is the responsivity) is calculated to be $7.8\times10^6$ Jones at 300 K. See Example 8 below. This is a 30 times increase over the previous generation of barrier devices. This improvement is mainly attributed to the reduced dark current and noise current density, an advantageous device property offered by reverse-biased p-n junction diodes.

Intraband $Ag_2Se$ CQD synthesis [21]: Intraband $Ag_2Se$ CQDs with absorption peak at 4.2 µm are synthesized in one embodiment using the following process. First, 1 M selenium precursor solution is prepared by dissolving Se powder in trioctylphosphine (TOP-Se), and 0.5 M silver precursor solution is prepared by dissolving AgCl in trioctylphosphine (TOP-Ag) inside glovebox. Then, 30 mL of oleylamine is heated to 90° C. under vacuum in a three-neck flask. After degassing the solution for 1 h, the atmosphere is switched to nitrogen. Afterwards, 8 mL of 1 M TOP-Se is injected at the temperature of 130° C. To increase the synthetic yield, 800 µL diphenylphosphine is added to 16 mL of 0.5 M TOP-Ag. This solution is rapidly injected, and the reaction is continued for 20 s. Then, 20 mL of butanol is injected into the reaction mixture, followed by cooling in a water bath to room temperature. The CQDs are precipitated with a mixture of ethanol and methanol by centrifugation. The resulting CQDs were washed three times with methanol and redispersed in octane.

PbS CQD synthesis [21]: PbS CQDs with absorption peak at 1000 nm are synthesized as follows. A 0.45 g of lead oxide is dissolved in 10 mL of 1-octadecene and 2 mL of oleic acid and the solution is heated to 110° C. in a three-neck flask under vacuum for 1 h. Then, 0.2 mL of hexamethyldisilathiane is added to 5 mL of anhydrous 1-octadecene to prepare the sulphur precursor solution, which is injected rapidly at 110° C. under nitrogen environment. The color of the solution turns dark brown immediately after the injection and the solution is cooled naturally. After the synthesis, the CQDs are precipitated using acetone by centrifugation inside glovebox and the final CQDs are redispersed in a mixture of hexane and octane.

Preparation of a binary CQD: To create a binary CQD in this embodiment, $Ag_2Se$ CQD and PbS CQD solution is mixed together following the desired mixture ratio. For the embodiment mentioned above, the mixture ratio of 0.04 (4 $Ag_2Se$ CQD per 100 PbS CQD) was made. It will be understood that other suitable mixture ratios could be used.

In one or more embodiments, the binary colloidal quantum dot device may include a top contact on a top surface of the binary colloidal quantum dot layer, and/or a bottom contact on a bottom surface of the binary colloidal quantum dot layer. Turning to the exemplary binary CQD device 10 of FIG. 3, one or more embodiments could include a top contact 30 that serves as a cathode, a bottom contact 20 that serves as an anode, binary CQDs 25 located between the top contact and the bottom contact, which serve as a photoconducting mid-infrared absorber layer, and this device is built on a substrate to create a single element detector or Si ROIC to form an imaging sensor (focal plane array). To fabricate the binary CQD device of the present embodiment, a 50 nm Cr/Au single metal pixel electrode pad (this can also be multipixel pad of silicon readout integrated circuit for imaging applications) is fabricated on a 10 mm×10 mm glass substrate using a shadow mask. Then, a layer of binary CQD mixture is deposited using spin-casting at 2000 rpm for 30 s. In other embodiments, the binary colloidal quantum dot layer is deposited using one or more of spin-casting, spray-casting, dip-casting, drop-casting, and blade casting. The CQDs in the as-deposited film are coated with a long insulating ligand on the surface. A ligand exchange procedure using 1,2-ethandithiol (a mild silicon-compatible chemical treatment, which replaces the long CQD surface capping ligand to a much shorter one) is conducted, which will increase the electronic coupling between CQDs by decreasing the interdot distance. The thickness of a binary CQD film will be increased (up to 120-180 nm) by repeating this layer-by-layer deposition and ligand exchange procedure 12-18 times. A top 50 nm Au contact electrode with an optical opening will be fabricated using a shadow mask to complete the binary CQD device. This solution-based device fabrication process can be easily expanded to a wafer scale, which will significantly bring down the cost of a thermal infrared imaging system based on the present invention.

The disclosure is now described with reference to the following examples. Before describing several exemplary embodiments of the disclosure, it is to be understood that the disclosure is not limited to the details of construction or process steps set forth in the following description. The disclosure is capable of other embodiments and of being practiced or being carried out in various ways.

EXAMPLES

Device characterization [19,21]: Photocurrent was measured by illuminating the device with a calibrated blackbody heated at 900° C. A chopper was used to modulate the blackbody radiation at 15 Hz, where the light was filtered through a set of mid-infrared band-pass filters. A preamplifier (SR570) coupled with a lock-in amplifier (SR830) was used to measure the photocurrent. The preamplifier also provided a bias of 1.5 V. The responsivity was calculated by dividing measured photocurrent with the optical power estimated for each filter.

Chemicals: Oleylamine (OLA, 70%), trioctylphosphine (TOP, 90%), selenium (Se, 99.999%), silver chloride (AgCl, 99%), lead oxide (PbO, 99.999%), hexamethyldisilathiane (TMS$_2$S, synthesis grade), 1-octadecene (ODE, 90%), oleic acid (OA, 90%), potassium hydroxide (KOH, 85%), zinc acetate dihydrate (Zn(CH$_3$COO)$_2$·2H$_2$O, 98%), 1,2-ethan-edithiol (EDT, 98.0%), l-butanol (99.8%), hexane (98.5%), methanol (99.8%), octane (99%), chloroform (99.8%), and ethyl alcohol (99.5%) were purchased from Sigma-Aldrich and were used as received.

Ag$_2$Se CQD Synthesis: Ag$_2$Se CQDs with an absorption peak at 4.2 μm were synthesized following the previously reported procedure. At first, 1 M selenium precursor solution was prepared by dissolving Se powder in trioctylphosphine (TOP-Se), and 0.5 M silver precursor solution was prepared by dissolving AgCl in trioctylphosphine (TOP-Ag) inside glovebox. Then, 30 mL of oleylamine was heated to 90° C. under vacuum in a three-neck flask. After degassing the solution for 1 h, the atmosphere was switched to nitrogen. Then, 8 mL of 1 M TOP-Se was injected at the temperature of 130° C. To increase the synthetic yield, 800 μL of diphenylphosphine was added to 16 mL of 0.5 M TOP-Ag. The solution was rapidly injected, and the reaction continued for 20 s. Then, 20 mL of butanol was injected into the reaction mixture, followed by cooling in a water bath to room temperature. The CQDs were precipitated with a mixture of ethanol and methanol by centrifugation. The resulting CQDs were washed three times with methanol and redispersed in octane. See Example 9 below.

PbS CQD Synthesis: PbS CQDs with an absorption peak at 1000 nm were synthesized following a previously developed protocol. In this procedure, 0.45 g of lead oxide was dissolved in 10 mL of 1-octadecene and 2 mL of oleic acid, and the solution was heated to 110° C. in a three-neck flask under vacuum for 1 h. Then, 0.2 mL of hexamethyldisilathiane was added to 5 mL of anhydrous 1-octadecene to prepare the sulfur precursor solution, which was injected rapidly at 110° C. under nitrogen environment into the reaction flask. The color of the solution turned dark brown immediately after the injection, and the solution was cooled naturally. After the synthesis, the CQDs were precipitated using acetone by centrifugation inside the glovebox and the final QDs were redispersed in a mixture of hexane and octane.

ZnO Nanoparticle Synthesis: ZnO nanoparticles were synthesized by following the literature method. In this procedure, 1.4 g of zinc acetate dihydrate (Zn(CH$_3$COO)$_2$·2H$_2$O) was dissolved in 60 mL of methanol, and the solution was transferred to a three-neck flask at 65° C. Then, 0.70 g of potassium hydroxide (KOH) was dissolved in 30 mL of methanol, and the solution was added dropwise to the zinc acetate solution for about 5 min with constant stirring. A milky white solution was obtained after stirring the mixture for 2 h 30 min at 65° C. The mixture was naturally cooled for 1 h. Finally, the ZnO nanoparticles were precipitated by centrifugation and dissolved in 5 mL of chloroform to prepare an optically transparent solution.

Device Fabrication: Glass substrates (10×10 mm) were used to fabricate p-n junction devices. First, the substrate was sonicated with isopropyl alcohol, acetone, and hexane, flushed with isopropyl alcohol, and dried with N$_2$ gas flow. A bottom contact of 50 nm (Cr/Au) was then deposited using a shadow mask by thermal evaporation. Next, 20 nm MoO$_x$ was blanket deposited using thermal evaporation. Both bottom contact (Cr/Au) and MoO$_x$ were deposited at a rate of 1 Å/s under a vacuum of 2×10$^{-6}$ mbar. For preparing the binary CQD solution, Ag$_2$Se and PbS QD solution were mixed in a glass vial and stirred with vortex machine for 60 s and filtered through a 0.2 μm PTFE syringe filter prior to deposition. A total of 10-12 layers of CQD blend solution were deposited via spin coating at 2000 rpm for 30 s. After each layer of the CQD film deposition, the device was ligand-exchanged by dipping it in 0.01 M 1,2-ethanedithiol (in methanol) for 30 s and rinsing it with methanol for 20 s. On top of binary CQD layers, two layers of ZnO were deposited by spin coating (2500 rpm, 30 s). For top contact, 50 nm aluminum with an optical opening of 200×200 μm defined by two finger electrodes was deposited by thermal evaporation through a shadow mask.

Characterization: For optical absorption characterization, Fourier transform infrared (FTIR) spectra were collected using a Thermo Nicolet 370 FTIR spectrometer. Absorption spectra in the near-infrared range were collected using StellarNet UV-vis-NIR spectrometer (RW-NIRX-SR and BLK-CXR). A scanning electron microscopy (SEM) cross-sectional image of the device was collected by JEOL JSM-7900F.

For electrical characterization, current-voltage measurements were performed by a semiconductor parameter analyzer (Agilent 4155). For photocurrent measurements, a calibrated blackbody (Newport 67030, 900° C.) was used as the infrared illumination source. A germanium (Ge) long-pass filter was used to cut off short-wavelength infrared photons. For the spectral photocurrent, a set of Fabry-Perot band-pass filters was used, having center wavelengths varying from 2.5 to 7 μm. This illumination source was chopped at 15 Hz using an optical chopper. The photocurrent was measured by a lock-in amplifier (SR830) coupled with a preamplifier (SR570), where the preamplifier provided the required bias. The responsivity was determined by dividing the measured photocurrent with the optical illumination power calculated for each filter. To determine the specific detectivity of the device, the noise current density was measured at 15 Hz with a spectrum analyzer (SR760), where a preamplifier (SR570) was used to provide low-noise bias to the device. The spectrum analyzer, preamplifier, and the device were kept inside a Faraday cage and were grounded to minimize external noise. The specific detectivity was determined using the measured responsivity and noise current density values.

Figure 13:
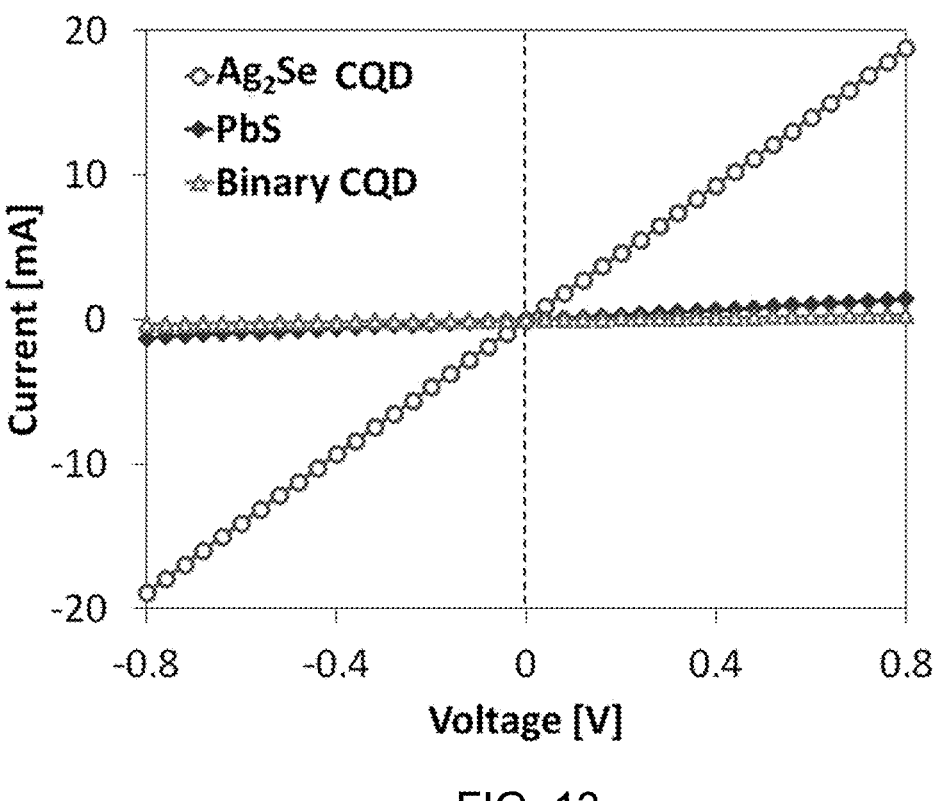
FIG. 13 shows the dark I-V characteristics of photoconductive devices made from binary CQD, Ag$_2$Se CQD, and PbS CQD films.

Example 1. Electrical Resistivity Comparison of Device Composed of Binary CQD and $Ag_2Se$ CQD-Only Film FIG. 13 shows the I-V characteristics obtained from binary CQD (optimized mixture ratio of $N_{Ag2Se}/N_{PbS}=0.04$, $Ag_2Se$ CQD, and PbS CQD photoconductive devices under dark. The device resistivity was extracted from the slope of the I-V. The calculated devices resistivities were $1.6\times10^5$ $\Omega\cdot$cm for binary CQD (Au—Mo-binary CQD-Mo—Au device), $1.2\times10^3$ $\Omega\cdot$cm for $Ag_2Se$ CQD (Au—$Ag_2Se$ CQD-Au), and $1.1\times10^5$ $\Omega\cdot$cm for PbS CQD (Au—Mo—PbS CQD-Mo—Au device) devices.

Example 2. MWIR Absorbance of ZnO Nanoparticle Film

Figure 14:
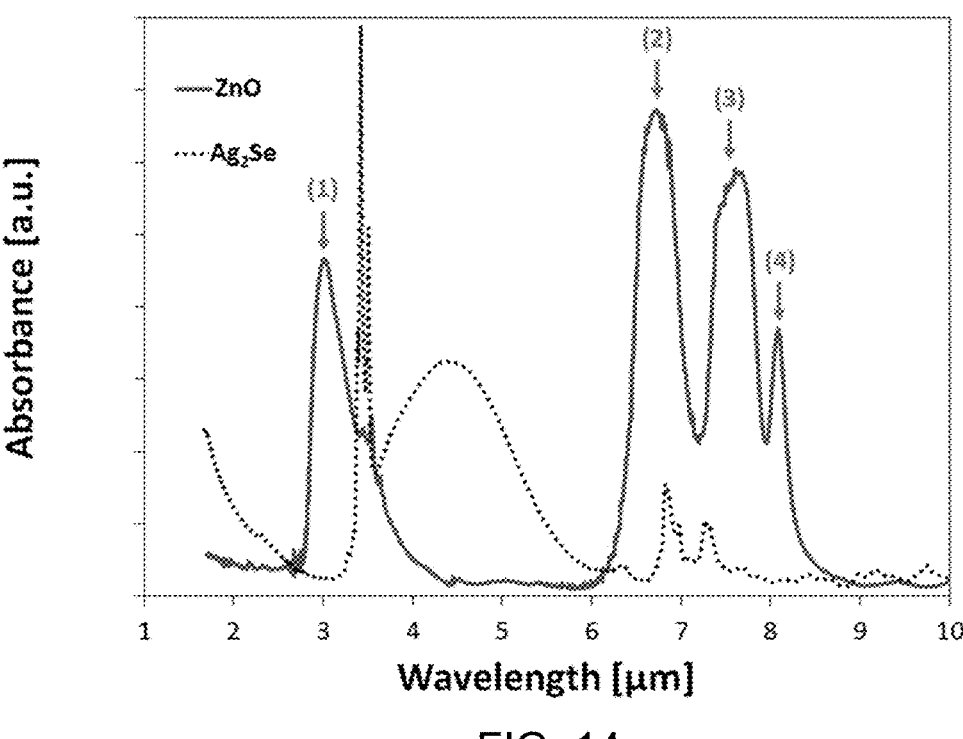
FIG. 14 shows the Fourier transform infrared (FTIR) spectrum of ZnO nanoparticle film. The absorbance of Ag$_2$Se CQD film is overlaid.

FIG. 14 shows Fourier transform infrared (FTIR) spectrum of ZnO nanoparticle film prepared on a KBr card. The broad peaks at 3-3.5 µm (peak 1) comes from the hydroxyl (OH) group.[1] Other characteristic peaks at 6.7 µm (peak 2), 7.7 µm (peak 3) and 8.1 µm (peak 4) arise due to the presence of C—H stretch, primary and secondary alcohol, respectively.[2] The absorbance of $Ag_2Se$ CQD film is overlaid to show that the primary 4.2 µm absorbance peak of $Ag_2Se$ CQDs resides outside the major absorbance peaks produced by ZnO nanoparticle film.

Example 3. Ohmic Contact Characteristics

Figure 15A:
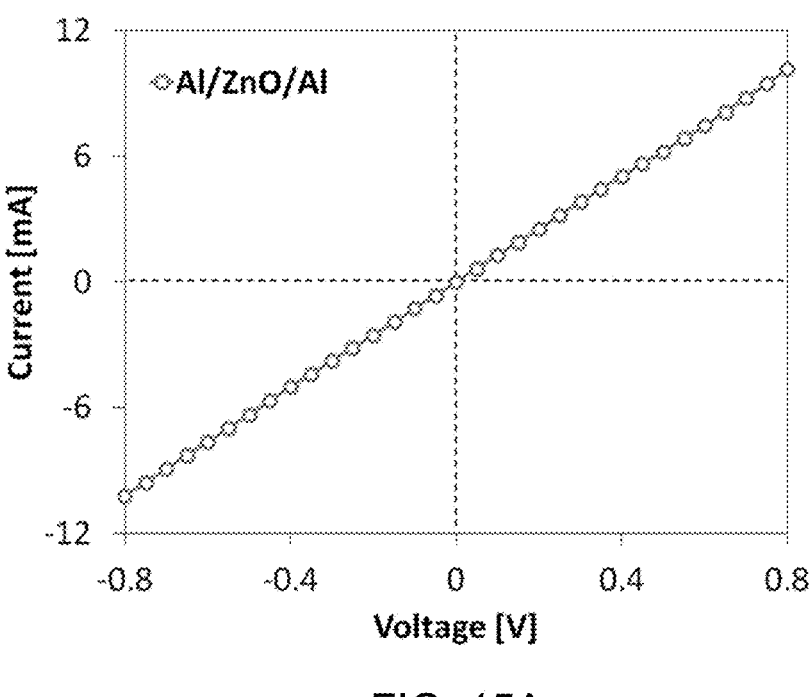
FIGS. 15A and 15B show the I-V characteristics of Al—ZnO—Al and Au—MoO$_x$-binary CQD-MoO$_x$—Au devices showing Ohmic characteristics.
Figure 15B:
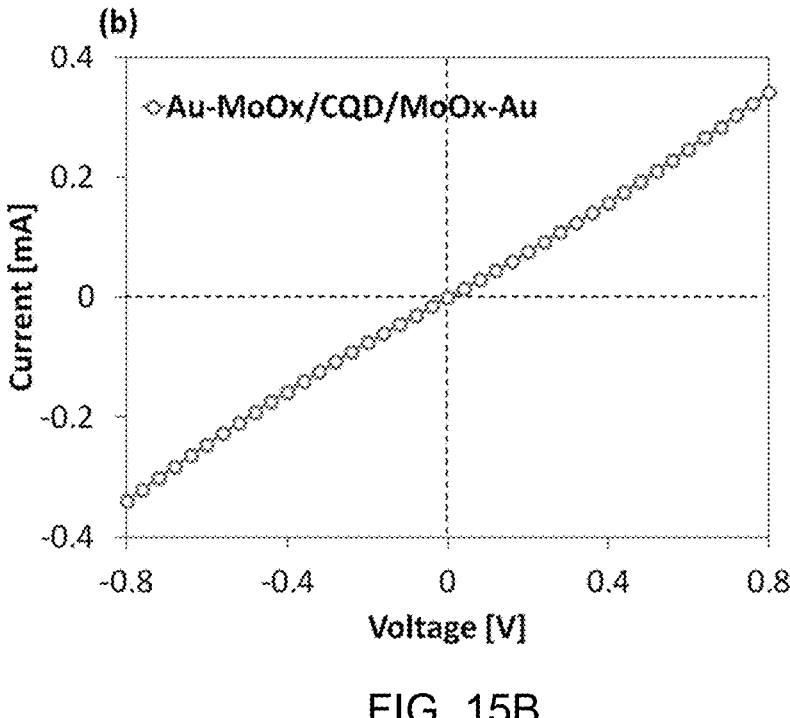

To confirm that Al—ZnO and Au—$MoO_x$-binary CQD form Ohmic contacts, Al—ZnO—Al and Au—$MoO_x$—binary CQD-$MoO_x$—Au devices were fabricated and I-V characteristics were obtained as shown in FIGS. 15A and 15B. FIG. 15A illustrates the I-V characteristics of Al—ZnO—Al and FIG. 15B illustrates the characteristics Au—$MoO_x$-binary CQD-$MoO_x$—Au devices showing Ohmic characteristics.

Example 4. Binary CQD Mixing Ratio ($N_{Ag2Se}$: $N_{PbS}$)

The weight of the $Ag_2Se$ and PbS CQD were measured, denoted respectively as $W_{Ag2Se}$ and $W_{PbS}$, in gram (g). The weight of the CQD is represented by the following equation:
Weight=Volume×Density Using the above equation, weight of the CQD can be represented as:

$$W_{Ag2Se}:W_{PbS}=(N_{Ag2Se}\times V_{Ag2Se})\times D_{Ag2Se}:(N_{PbS}\times V_{PbS})\times D_{PbS} \quad (2)$$

where, $W_{Ag2Se}$: Measured weight of the $Ag_2Se$ CQD in the mixture; $W_{PbS}$: Measured weight of the PbS CQD in the mixture; $N_{Ag2Se}$: Total number of $Ag_2Se$ CQDs; $N_{PbS}$: Total number of PbS CQDs.

Considering that the $Ag_2Se$ CQD has a diameter of 5.5 nm, $V_{Ag2Se}$ is calculated to be $8.71\times10^{-20}$ $cm^3$ using the following equation:

$V_{Ag2Se}$: Volume of a single $Ag_2Se$ CQD, where
$V_{Ag2Se}=4/3\pi(D/2)^3$

Considering that the PbS CQD has a diameter of 3.2 nm, $V_{PbS}$ is calculated to be $1.72\times10^{-20}$ $cm^3$ using the following equation:

$V_{PbS}$: Volume of a single PbS CQD, where $V_{PbS}=4/3\pi(D/2)^3$ $\quad (3)$ Using bulk density values of $D_{Ag2Se}$: Density of $Ag_2Se$ (8.22 $g/cm^3$) and $D_{PbS}$: Density of PbS (7.61 $g/cm^3$), we use equation (1) to obtain CQD number ratio as follows:

$$N_{Ag2Se}:N_{PbS}=W_{Ag2Se}W_{PbS}\times(V_{PbS})\times(D_{PbS})(V_{Ag2Se})\times(D_{Ag2Se})$$

Figure 16A:
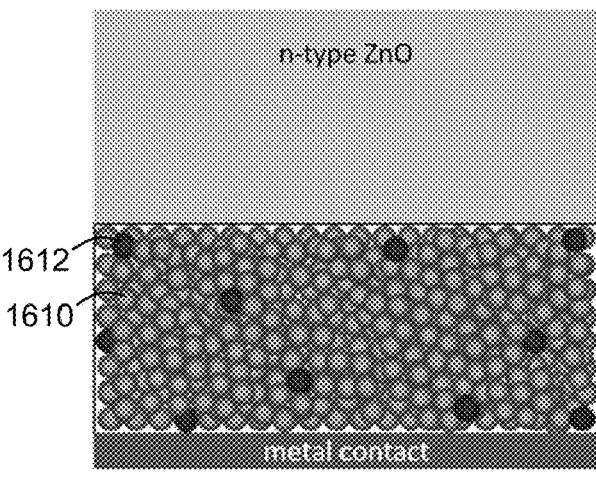
FIGS. 16A through 16C show the appearance of shunt current path with increasing Ag$_2$Se CQD loading in the binary CQD blend.
Figure 16B:
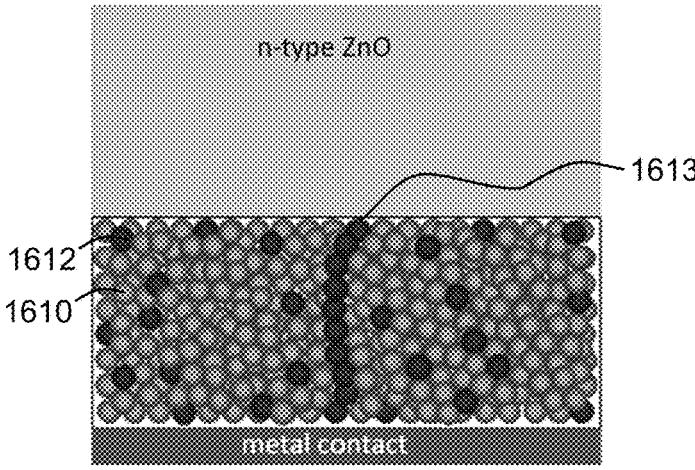
Figure 16C:
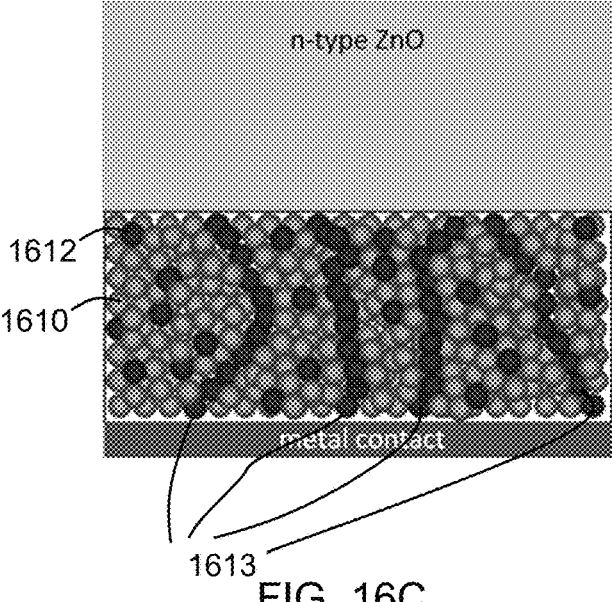

Example 5. Evolution of Shunt Current Path with Increasing $Ag_2Se$ CQD Loading FIGS. 16A through 16C show the appearance of shunt current path with increasing $Ag_2Se$ CQD loading in the binary CQD blend. When $N_{Ag2Se}:N_{PbS}$ is low, $Ag_2Se$ CQD is sparsely distributed inside the binary CQD film but as the $Ag_2Se$ CQD loading increase, the probability of creating a direct shunt path (high conductive path since $Ag_2Se$ CQD is degenerately-doped n-type) between the top n-type ZnO and bottom metal contact increases. The filament created in the binary CQD will serve as an effective shunt component that penetrates directly through the p-n junction diode because this conduction path consists of n-type ZnO/n-type $Ag_2Se$ CQD/metal contact. Further increase in $Ag_2Se$ loading ($N_{Ag2Se}:N_{PbS}$=high) creates a greater number of shunt current paths. Specifically, FIGS. 16A through 16C are schematic illustrations of the evolution of shunt current path created by increasing $Ag_2Se$ CQD loading for $N_{Ag2Se}$: $N_{PbS}$=low (FIG. 16A), $N_{Ag2Se}:N_{PbS}$=medium (FIG. 16B), and $N_{Ag2Se}:N_{PbS}$=high (FIG. 16C). Dark spheres 1612 represent $Ag_2Se$ CQDs and lighter spheres 1610 represent PbS CQDs. Shunt components (or shunt current paths) 1613 are depicted in FIGS. 16B and 16C, where $N_{Ag2Se}:N_{PbS}$ is higher than in FIG. 16A.

Example 6. Photocurrent vs. Time

Figure 17:
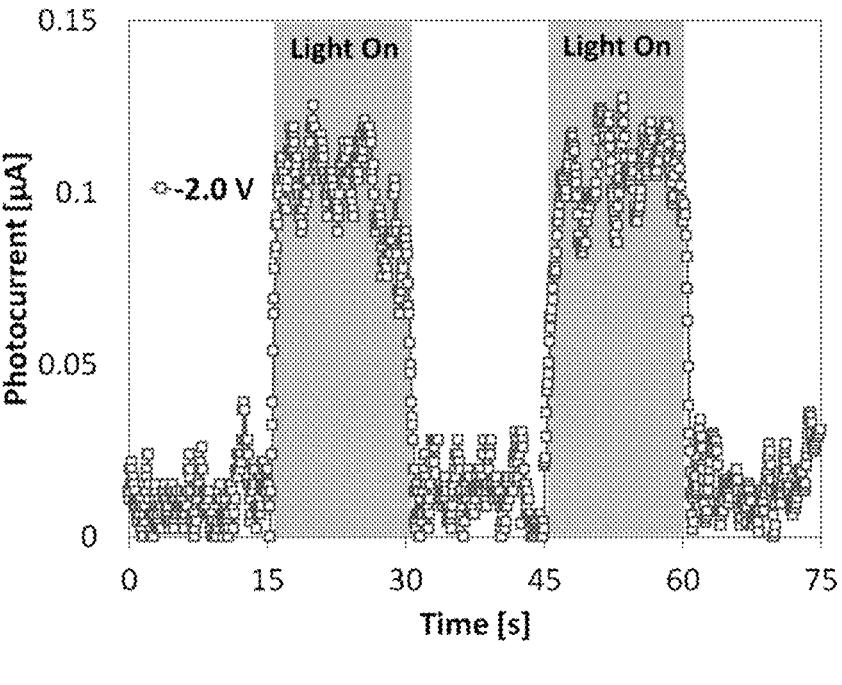
FIG. 17 shows the photocurrent measured from the binary CQD device as a function of time when the infrared illumination was on and off.

FIG. 17 shows the photocurrent measured from the binary CQD device as a function of time when the infrared illumination was on and off.

Example 7. Noise Current Density vs. Frequency

Figure 18:
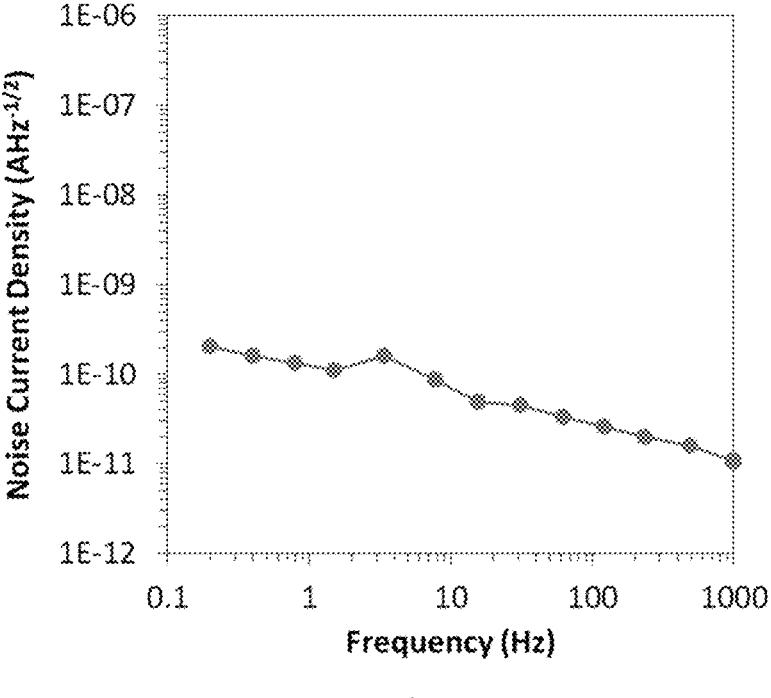
FIG. 18 shows the noise current density measured as a function of frequency from binary CQD devices.

FIG. 18 shows the noise current density measured as a function of frequency from binary CQD devices.

Example 8. Detector Performance Parameters and Comparison

Table 2 below summarizes the binary CQD detector performance parameters and their comparison to the previous literature reports.

TABLE 2

Table summarizing the mid-IR CQD detector performance parameters.

| T [K] | $\lambda$peak [μm] | R [mA/ W] | In [pAHz$^{-1/2}$] | D* [Jones] | CQD material | Device Structure | Ref. |
|---|---|---|---|---|---|---|---|
| 80 | 4.8 | 230 | 0.1 | $5.4 \times 10^{10}$ | HgTe | photo-conductor | 3 |
| 80 | 5 | 0.13 | 1 | $2.6 \times 10^{7}$ | HgSe | photo-conductor | 4 |
| 80 | 4.4 | 0.1 | 0.1 | $1.5 \times 10^{9}$ | HgSe | CQDIP | 5 |
| 85 | 4.5 | 1620 | 0.07 | $4 \times 10^{11}$ | HgTe | photodiode | 6 |
| 138 | 4 | 81 | 0.7 | $1.1 \times 10^{10}$ | HgTe | photodiode | 7 |
| 300 | 6 | 800 | 103 | $10^{8}$ | HgSe | photo-conductor | 8 |
| 300 | 4.5 | 13.3 | 103 | $3 \times 10^{5}$ | Ag$_2$Se | barrier device | 9 |
| 300 | 4.5 | 19 | 50 | $7.8 \times 10^{6}$ | Ag$_2$Se | photodiode | (this study) |

Example 9. TEM of Ag$_2$Se CQDs

Figure 19:
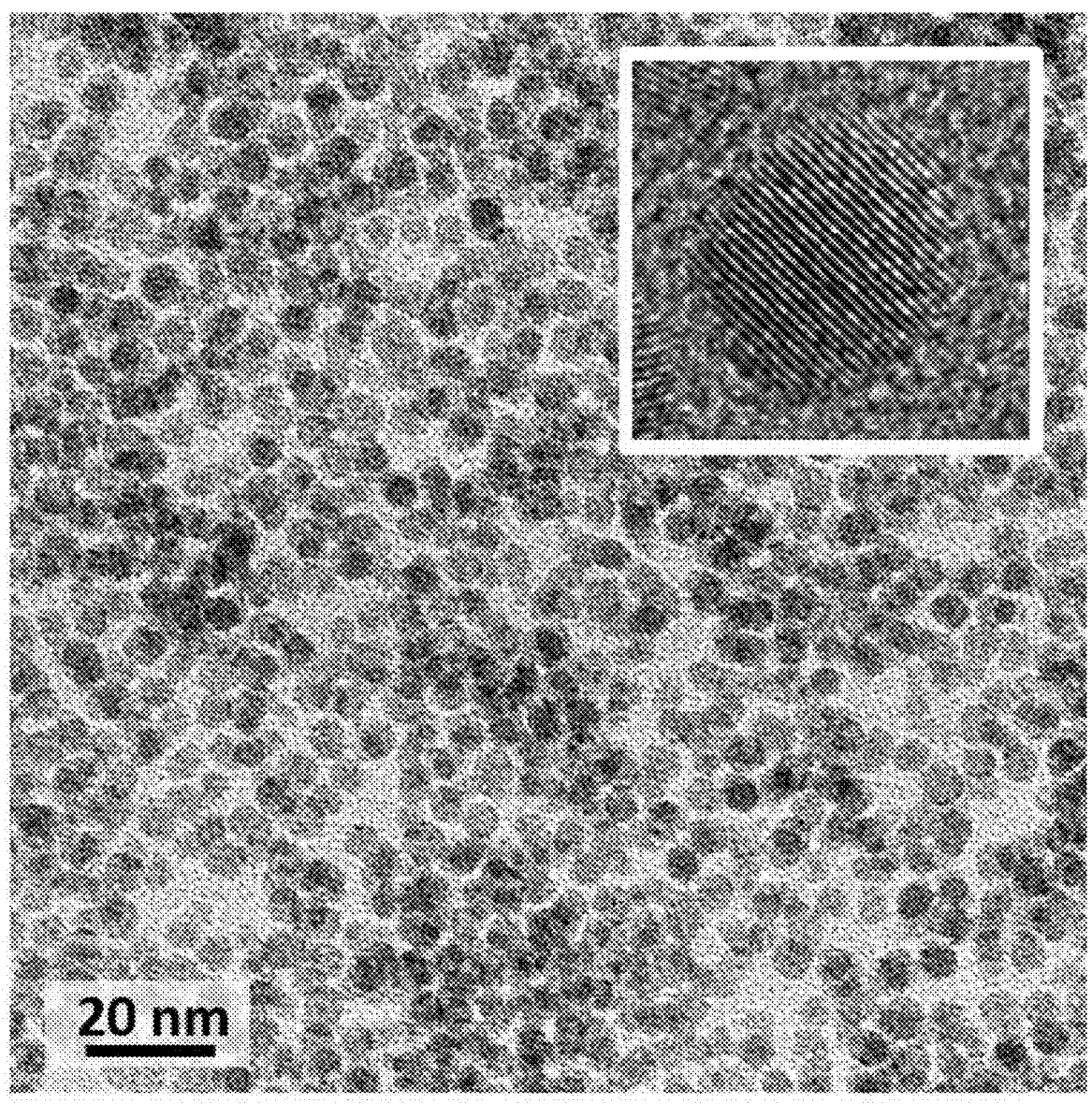
FIG. 19 shows the TEM and HRTEM (inset) of as-synthesized Ag$_2$Se CQDs used in the devices.

FIG. 19 shows the TEM and HRTEM (inset) of as-synthesized Ag$_2$Se CQDs used in the devices.

REFERENCES

1. C. R. Kagan, E. Lifshitz, E. H. Sargent, D. V. Talapin, Building devices from colloidal quantum dots. Science (2016). https://doi.org/10.1126/science.aac5523
2. A. Rogalski, Infrared detectors: status and trends. Prog. Quantum Electron. 27, 59-210 (2003)
3. A. Rogalski, J. Antoszewski, L. Faraone, A. Rogalski, J. Antoszewski, L. Faraone, Third-generation infrared photodetector arrays. J. Appl. Phys. 105, 091101 (2017). https://doi.org/10.1063/1.3099572
4. Council, N. R., *Expanding the vision of sensor materials* (The National Academies Press, Washington, D C, 1995). https://doi.org/10.17226/4782
5. C. Downs, T. E. Vandervelde, Progress in infrared photodetectors since 2000. Sensors 13, 5054-5098 (2013). https://doi.org/10.3390/s130405054
6. A. Rogalski, HgCdTe infrared detector material: history, status and outlook. Rep. Prog. Phys. 68, 2267 (2005)
7. E. J. D. Klem, C. Gregory, D. Temple, J. Lewis, PbS colloidal quantum dot photodiodes for low-cost SWIR sensing. Proc. SPIE 9451, 945104 (2015)
8. D. S. Temple, A. Hilton, E. J. D. Klem, Towards low-cost infrared imagers: how to leverage Si IC ecosystem. Proc. SPIE 9989, 99890E (2016)
9. C. Buurma, R. E. Pimpinella, A. J. Ciani, J. S. Feldman, C. H. Grein, P. Guyot-Sionnest, MWIR imaging with low cost colloidal quantum dot films. Proc. SPIE 9933, 993303 (2016). https://doi.org/10.1117/12.2239986
10. A. Rogalski, K. Chrzanowski, Infrared devices and techniques. Opto-Electron. Rev. 10, 111-136 (2002)
11. R. Del, P. Moreira, C. Roberto, D. S. Filho, Detection of methane plumes using airborne midwave infrared (3-5 μm) hyperspectral data. Remote Sens. 2, 1-16 (2018). https://doi.org/10.3390/rs10081237
12. S. Bagavathiappan, T. Saravanan, J. Philip, T. Jayakumar, B. Raj, R. Karunanithi, T. M. R. Panicker, M. P. Korath, K. Jagadeesan, Infrared thermal imaging for detection of peripheral vascular disorders. J. Med. Phys. 34, 43-47 (2009). https://doi.org/10.4103/0971-6203.48720

13. A. Haddadi, S. Adhikary, A. Dehzangi, M. Razeghi, Mid-wavelength infrared heterojunction phototransistors based on type-II InAs/AlSb/GaSb superlattices. Appl. Phys. Lett. 109, 021107 (2016). https://doi.org/10.1063/1.4958715
14. Deng, Z.; Jeong, K. S.; Guyot-Sionnest, P. Colloidal Quantum Dots Intraband Photodetectors. *ACS Nano* 2014, 8, 11707-11714, DOI: 10.1021/nn505092a
15. Lhuillier, E.; Scarafagio, M.; Hease, P.; Nadal, B.; Aubin, H.; Xu, X. Z.; Lequeux, N.; Patriarche, G.; Ithurria, S.; Dubertret, B. Infrared Photodetection Based on Colloidal Quantum-Dot Films with High Mobility and Optical Absorption up to THz. *Nano Lett.* 2016, 16, 1282-1286, DOI: 10.1021/acs.nanolett.5b04616
16. Tang, X.; Wu, G. F.; Lai, K. W. C. Plasmon Resonance Enhanced Colloidal HgSe Quantum Dot Filterless Narrowband Photodetectors for Mid-Wave Infrared. *J. Mater. Chem. C* 2017, 5, 362-369, DOI: 10.1039/c6tc04248a
17. Lan, X.; Chen, M.; Hudson, M. H.; Kamysbayev, V.; Wang, Y.; Guyot-Sionnest, P.; Talapin, D. V. Quantum Dot Solids Showing State-Resolved Band-Like Transport. *Nat. Mater.* 2020, 19, 323-329, DOI: 10.1038/s41563-019-0582-2
18. Qu, J.; Goubet, N.; Livache, C.; Martinez, B.; Amelot, D.; Greboval, C.; Chu, A.; Ramade, J.; Cruguel, H.; Ithurria, S.; Silly, M. G.; Lhuillier, E. Intraband Mid-Infrared Transitions in Ag$_2$Se Nanocrystals: Potential and Limitations for Hg-Free Low-Cost Photodetection. *J. Phys. Chem. C* 2018, 122, 18161-18167, DOI: 10.1021/acs.jpcc.8b05699
19. Hafiz, S. B.; Scimeca, M. R.; Zhao, P.; Paredes, I. J.; Sahu, A.; Ko, D.-K. Silver Selenide Colloidal Quantum Dots for Mid-Wavelength Infrared Photodetection. *ACS Appl. Nano Mater.* 2019, 2, and 1631-1636, DOI: 10.1021/acsanm.9b00069
20. Hafiz, S. B.; Scimeca, M. R.; Sahu, A.; Ko, D.-K. Mid-Infrared Colloidal Quantum Dot Based Nanoelectronics and Nano-Optoelectronics. *ECS Trans.* 2019, 92, 11-16, DOI: 10.1149/09201.0011ecst
21. Hafiz, S; Al Mahfuz, M. M.; Ko, D.-K. Vertically-Stacked Intraband Quantum Dot Devices For Mid-Wavelength Infrared Photodetection, *ACS Appl. Mater. Interfaces* 2021, 13, 937-943.
22. Hafiz, S; Al Mahfuz, M. M.; Ko, D.-K. Intraband Quantum Dot Barrier Devices—Optimization of Energy Level Alignment. *ECS Trans.* 2021, 102, 45-51.
23. Ramiro, I.; Ozdemir, O.; Christodoulou, S.; Gupta, S.; Dalmases, M.; Torre, I.; Konstantatos, G. Mid- And Long-Wave Infrared Optoelectronics via Intraband Transitions in PbS Colloidal Quantum Dots. *Nano Lett.* 2020, 20, 1003-1008, DOI: 10.1021/acs.nanolett.9b04130
24. Chen, M.; Shen, G.; Guyot-Sionnest, P. Size Distribution Effects on Mobility and Intraband Gap of HgSe Quantum Dots. *J. Phys. Chem. C* 2020, 124, 16216-16221, DOI: 10.1021/acs.jpcc.0c05268
25. Melnychuk, C.; Guyot-Sionnest, P. Auger Suppression in n-Type HgSe Colloidal Quantum Dots. *ACS Nano* 2019, 13, 10512-10519, DOI: 10.1021/acsnano.9b04608

While exemplary embodiments have been described herein, it is expressly noted that these embodiments should not be construed as limiting, but rather that additions and modifications to what is expressly described herein also are included within the scope of the invention. Moreover, it is to be understood that the features of the various embodiments described herein are not mutually exclusive and can exist in various combinations and permutations, even if such combinations or permutations are not made express herein, without departing from the spirit and scope of the invention.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

What is claimed is:

1. A binary colloidal quantum dot device comprising: a binary colloidal quantum dot layer on a substrate, the binary colloidal quantum dot layer comprising a plurality of a first mid-wavelength infrared absorbing intraband colloidal quantum dot embedded in a plurality of a second colloidal quantum dot, wherein there is from 1 to 18 of the first mid-wavelength infrared absorbing intraband colloidal quantum dot per 100 of the second colloidal quantum dot.

2. The binary colloidal quantum dot device of claim 1, wherein the first mid-wavelength infrared absorbing intraband colloidal quantum dot comprises one or more of silver selenide ($Ag_2Se$), mercury sulfide (HgS), mercury selenide (HgSe), and electron-doped lead sulfide (PbS).

3. The binary colloidal quantum dot device of claim 2, wherein the second colloidal quantum dot comprises one or more of lead sulfide (PbS), lead selenide (PbSe), lead telluride (PbTe), cadmium sulfide (CdS), cadmium selenide (CdSe), cadmium telluride (CdTe), zinc sulfide (ZnS), zinc selenide (ZnSe), zinc telluride (ZnTe), tin sulfide (SnS), tin selenide (SnSe), tin telluride (SnTe), indium phosphide (InP), indium arsenide (InAs), indium antimonide (InSb), gallium phosphide (GaP), gallium arsenide (GaAs), and gallium antimonide (GaSb).

4. The binary colloidal quantum dot device of claim 3, wherein the first mid-wavelength infrared absorbing intraband colloidal quantum dot comprises silver selenide ($Ag_2Se$) and the second colloidal quantum dot comprises lead sulfide (PbS).

5. The binary colloidal quantum dot device of claim 4, wherein there is about 4 of the first mid-wavelength infrared absorbing intraband colloidal quantum dot per 100 of the second colloidal quantum dot.

6. The binary colloidal quantum dot device of claim 4, wherein the first mid-wavelength infrared absorbing intraband colloidal quantum dot has an average diameter of 5.5 nm and the second colloidal quantum dot has an average diameter of 3.2 nm.

7. The binary colloidal quantum dot device of claim 1, further comprising a top contact on a top surface of the binary colloidal quantum dot layer, and/or a bottom contact on a bottom surface of the binary colloidal quantum dot layer.

8. The binary colloidal quantum dot device of claim 7, wherein the bottom contact is patterned on a substrate.

9. The binary colloidal quantum dot device of claim 1, wherein the binary colloidal quantum dot layer is deposited on the substrate using one or more of spin-casting, spray-casting, dip-casting, drop-casting, and blade casting.

10. The binary colloidal quantum dot device of claim 1, wherein the binary colloidal quantum dot layer is ligand-exchanged using one or more of 1,2-ethanedithiol, pyridine, ethylenediamine, 3-mercaptopropionic acid, sodium sulfide ($Na_2S$), tetrabutylammonium iodide, $NH_4SCN$, $(NH_4)_3AsS_3$, metal chalcogenide ligand, and methylammonium lead triiodide perovskite ligand.

11. The binary colloidal quantum dot device of claim 7, further comprising a conductive layer on a top surface of the bottom contact.

12. The binary colloidal quantum dot device of claim 11, wherein the conductive layer comprises one or more of molybdenum oxide (MoOx), nickel oxide (NiO), vanadium oxide ($V_2O_5$), lead iodide (PbI), polythiophenes, poly(p-phenylene vinylene), polyfluorene, and the like.

13. The binary colloidal quantum dot device of claim 7, further comprising a nanoparticle layer on the top surface of the binary colloidal quantum dot layer.

14. The binary colloidal quantum dot device of claim 13, wherein the nanoparticle layer comprises one or more of zinc oxide (ZnO), titanium oxide ($TiO_2$), tin oxide ($SnO_2$), or an n-type conductive polymer selected from one or more of poly(benzimidazobenzophenanthroline) ladder type and semi-ladder type, poly(bisindenofluorenedicyanovinylene), poly(naphthalene diimide) derivatives, and poly(perylene diimide) derivatives.

15. A binary colloidal quantum dot device comprising:
a binary colloidal quantum dot layer on a substrate, the binary colloidal quantum dot layer comprising a plurality of a mid-wavelength infrared absorbing intraband silver selenide ($Ag_2Se$) colloidal quantum dot embedded in a plurality of
a lead sulfide (PbS) colloidal quantum dot, wherein there is from 1 to 18 of the mid-wavelength infrared absorbing intraband silver selenide ($Ag_2Se$) colloidal quantum dot per 100 of the lead sulfide (PbS) colloidal quantum dot.

16. The binary colloidal quantum dot device of claim 15, wherein there is about 4 of the mid-wavelength infrared absorbing intraband silver selenide ($Ag_2Se$) per 100 of the lead sulfide (PbS) colloidal quantum dot.

17. The binary colloidal quantum dot device of claim 15, further comprising a top contact on a top surface of the binary colloidal quantum dot layer, and/or a bottom contact on a bottom surface of the binary colloidal quantum dot layer.

18. The binary colloidal quantum dot device of claim 17, further comprising a conductive layer on a top surface of the bottom contact.

19. The binary colloidal quantum dot device of claim 18, wherein the conductive layer comprises one or more of molybdenum oxide (MoOx), nickel oxide (NiO), vanadium oxide ($V_2O_5$), lead iodide (PbI), polythiophenes, poly(p-phenylene vinylene), polyfluorene, and the like.

20. The binary colloidal quantum dot device of claim 17, further comprising a nanoparticle layer on the top surface of the binary colloidal quantum dot layer.

21. The binary colloidal quantum dot device of claim 20, wherein the nanoparticle layer comprises one or more of zinc oxide (ZnO), titanium oxide ($TiO_2$), tin oxide ($SnO_2$), or an n-type conductive polymers selected from one or more of poly(benzimidazobenzophenanthroline) ladder type and semi-ladder type, poly(bisindenofluorenedicyanovinylene), poly(naphthalene diimide) derivatives, and poly(perylene diimide) derivatives.

* * * * *